United States Patent
Park et al.

(10) Patent No.: US 9,824,765 B2
(45) Date of Patent: Nov. 21, 2017

(54) MEMORY DEVICE, MEMORY SYSTEM, METHOD OF OPERATING THE MEMORY DEVICE, AND METHOD OF OPERATING THE MEMORY SYSTEM

(71) Applicant: SAMSUNG ELECTRONICS CO., LTD., Suwon-Si, Gyeonggi-Do (KR)

(72) Inventors: Sang-Soo Park, Hwaseong-si (KR); Yoon Kim, Yongin-si (KR); Won-Bo Shim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/251,090

(22) Filed: Aug. 30, 2016

(65) Prior Publication Data

US 2017/0069389 A1    Mar. 9, 2017

(30) Foreign Application Priority Data

Sep. 4, 2015 (KR) .......................... 10-2015-0125602

(51) Int. Cl.
G11C 16/10 (2006.01)
G11C 16/14 (2006.01)
(Continued)

(52) U.S. Cl.
CPC .............. *G11C 16/14* (2013.01); *G11C 16/08* (2013.01); *G11C 16/10* (2013.01); *G11C 16/32* (2013.01);
(Continued)

(58) Field of Classification Search
CPC ................................. G11C 16/10; G11C 16/14
(Continued)

(56) References Cited

U.S. PATENT DOCUMENTS 7,286,408 B1 * 10/2007 Higashitani ........ G11C 16/3427
365/185.18
7,995,392 B2 * 8/2011 Shibata .................. G11C 16/14
365/185.18
(Continued)

FOREIGN PATENT DOCUMENTS

JP         2010-199235        9/2010
KR       1020080044203       5/2008
(Continued)

*Primary Examiner* — Michael Tran
(74) *Attorney, Agent, or Firm* — F. Chau & Associates, LLP

(57) ABSTRACT

A method of erasing a non-volatile memory device which includes a plurality of NAND strings is provided as follows. A first voltage is applied to each of word lines for a corresponding effective erasing execution time. An erase operation is performed on memory cells connected to each of the word lines for the corresponding effective erasing execution time. A second voltage is applied to each of at least some word lines among the word lines for a corresponding erasing-prohibited time after the corresponding effective erasing execution time elapses. A sum of the corresponding effective erasing execution time and the corresponding erasing-prohibited time for each of the at least some word lines is substantially equal to an erasure interval during which an erase operation is performed using the first voltage and the second voltage higher than the first voltage. The word lines are stacked on a substrate.

19 Claims, 26 Drawing Sheets

(51) Int. Cl.
*G11C 16/08* (2006.01)
*G11C 16/32* (2006.01)
*G11C 16/04* (2006.01)
*G11C 16/34* (2006.01)

(52) U.S. Cl.
CPC ........ *G11C 16/0483* (2013.01); *G11C 16/349* (2013.01)

(58) Field of Classification Search
USPC ........................................ 365/185.29, 185.24
See application file for complete search history.

(56) References Cited

U.S. PATENT DOCUMENTS

| | | | | | |
|---|---|---|---|---|---|
| 8,174,895 | B2* | 5/2012 | Chen | ................... | G11C 11/5628 365/185.03 |
| 8,233,323 | B2 | 7/2012 | Hishida et al. | | |
| 8,767,466 | B2 | 7/2014 | Asaoka et al. | | |
| 8,787,094 | B2* | 7/2014 | Costa | ....................... | G11C 5/02 365/185.17 |
| 8,854,896 | B2 | 10/2014 | Hosono et al. | | |
| 8,913,431 | B1* | 12/2014 | Costa | ................. | G11C 16/0408 365/185.05 |
| 8,929,145 | B2 | 1/2015 | Lee et al. | | |
| 9,099,202 | B2* | 8/2015 | Mihnea | ............... | G11C 11/5671 |
| 9,214,240 | B2* | 12/2015 | Dutta | .................... | G11C 16/14 |
| 9,305,937 | B1* | 4/2016 | Tsutsumi | .......... | H01L 27/11582 |
| 9,330,778 | B2* | 5/2016 | Costa | ................. | G11C 16/3445 |
| 9,343,159 | B2* | 5/2016 | Dong | ................. | G11C 16/0483 |
| 9,514,824 | B2* | 12/2016 | Lin | ........................ | G11C 16/12 |
| 2006/0279999 | A1 | 12/2006 | Byeon et al. | | |
| 2008/0285355 | A1 | 11/2008 | Lee | | |
| 2012/0051136 | A1* | 3/2012 | Kang | ................... | G11C 16/344 365/185.17 |
| 2012/0243309 | A1* | 9/2012 | Asaoka | .............. | G11C 16/0483 365/182 |
| 2012/0300561 | A1* | 11/2012 | Yun | ........................ | G11C 5/025 365/189.09 |
| 2013/0016561 | A1* | 1/2013 | Nam | ................. | H01L 27/11556 365/185.11 |
| 2015/0179577 | A1* | 6/2015 | Tobitsuka | ......... | H01L 21/76895 257/314 |
| 2015/0179662 | A1* | 6/2015 | Makala | ............. | H01L 27/11582 257/314 |
| 2015/0194216 | A1* | 7/2015 | Abe | ................... | G11C 16/0483 365/185.05 |
| 2015/0262682 | A1* | 9/2015 | Futatsuyama | .......... | G11C 16/10 365/185.22 |
| 2016/0099059 | A1* | 4/2016 | Chen | ..................... | G11C 16/10 365/185.17 |
| 2016/0148835 | A1* | 5/2016 | Shimabukuro | ... | H01L 27/11556 257/314 |

FOREIGN PATENT DOCUMENTS

| | | |
|---|---|---|
| KR | 1020080052471 | 6/2008 |
| KR | 1020080091951 | 10/2008 |
| KR | 1020080101551 | 11/2008 |
| KR | 1020100034617 | 4/2010 |

* cited by examiner

US 9,824,765 B2

MEMORY DEVICE, MEMORY SYSTEM, METHOD OF OPERATING THE MEMORY DEVICE, AND METHOD OF OPERATING THE MEMORY SYSTEM

CROSS-REFERENCE TO RELATED APPLICATION

This application claims priority under 35 U.S.C. §119 to Korean Patent Application No. 10-2015-0125602, filed on Sep. 4, 2015, in the Korean Intellectual Property Office, the disclosure of which is incorporated by reference herein in its entirety.

TECHNICAL FIELD

The present inventive concept relates to a memory device, a memory system, a method of operating the memory device, and a method of operating the memory system.

DISCUSSION OF RELATED ART

Memory devices are used to store data and are classified into volatile memory devices and nonvolatile memory devices. A flash memory device which is an example of a nonvolatile memory device may be used in mobile phones, digital cameras, personal digital assistants (PDAs), mobile computer devices, fixed computer devices, and other devices.

SUMMARY

According to an exemplary embodiment of the present inventive concept, a method of erasing a non-volatile memory device which includes a plurality of NAND strings is provided as follows. A first voltage is applied to each of word lines for a corresponding effective erasing execution time. An erase operation is performed on memory cells connected to each of the word lines for the corresponding effective erasing execution time. A second voltage is applied to each of at least some word lines among the word lines for a corresponding erasing-prohibited time after the corresponding effective erasing execution time elapses. A sum of the corresponding effective erasing execution time and the corresponding erasing-prohibited time for each of the at least some word lines is substantially equal to an erasure interval during which an erase operation is performed using the first voltage and the second voltage higher than the first voltage. The word lines are stacked on a substrate.

According to an exemplary embodiment of the present inventive concept, a method of erasing a memory system including a memory controller and a non-volatile memory device is provided as follows. An erase command is transmitted from the memory controller to the non-volatile memory device. A first voltage is applied to each of word lines for a corresponding effective erasing execution time determined in a unit of at least one word line, in response to the erase command in an erase interval during which an erase operation is performed on a plurality of memory cells connected to each of word lines. A second voltage is applied to each of at least some word lines among the word lines in the erase interval and after the corresponding effective erasing execution time elapses. The second voltage is higher than the first voltage.

According to an exemplary embodiment of the present inventive concept, a memory device is provided as follows. A memory cell array includes NAND strings. Each NAND string includes memory cells. Each memory cell is connected to a corresponding word line of word lines vertically stacked on a substrate. A control logic generates an erase control signal to increase a voltage applied to each of the word lines. The erase control signal is generated in a unit of at least one word line during an erase interval in which an erase operation is performed on the memory cells.

According to an exemplary embodiment of the present inventive concept, a memory system is provided as follows. A memory device includes a memory cell array including NAND strings. Each NAND string includes memory cells. Each memory cell is connected to word lines vertically stacked on a substrate. A memory controller generates an erase control signal for controlling voltage change time points at which a voltage applied to the word lines increases, in a unit of at least one word line in an erase interval in which an erase operation is performed on the memory cells, and transmit the erase control signal to the memory device.

According to an exemplary embodiment of the present inventive concept, a method of operating a non-volatile memory device is provided as follows. A substrate voltage is applied to a substrate in response to an erase command. The substrate voltage is increased to a target voltage for a first erase interval and the target voltage is maintained for a second erase interval. A first voltage is applied to a first word line for a first effective erasing time after the first erase interval. The first voltage is applied to a second word line for a second effective erasing time after the first erase interval. The second effective erasing time is longer than the first effective erasing time. A second voltage is applied to the first word line for a first erasing-prohibited time after the first effective erasing time. The first word line and the second word line are vertically stacked on the substrate. The second word line is positioned above the first word line. A sum of the first effective erasing time and the first erasing-prohibited time is substantially equal to the second effective erasing time.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
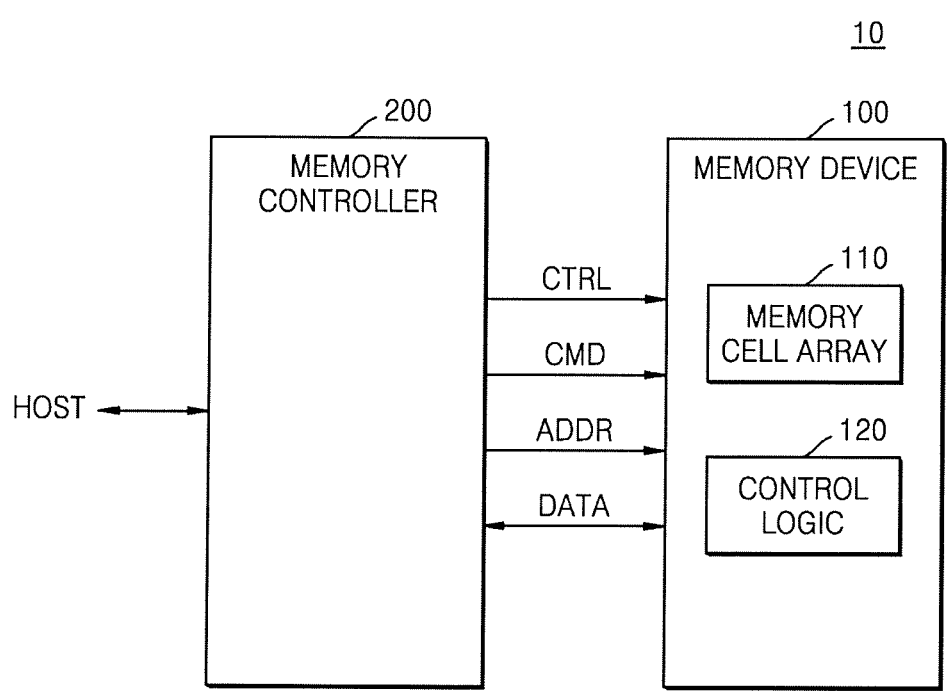
FIG. 1 is a schematic block diagram of a memory system according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a schematic block diagram of a memory system 10 according to an exemplary embodiment of the present inventive concept.

Referring to FIG. 1, the memory system 10 may include a memory device 100 and a memory controller 200, and the memory device 100 may include a memory cell array 110 and a control logic 120.

The memory controller 200 may control the memory device 100 to read data from or write data to the memory device 100 in response to a read/write command received from a host. For example, the memory controller 200 may control performing of a program/write operation, a read operation, and an erase operation on the memory device 100 by providing the memory device 100 with an address ADDR, a command CMD, and a control signal CTRL. Also, data DATA for performing the program operation and read data DATA may be exchanged between the memory controller 200 and the memory device 100.

The memory cell array 110 may include a plurality of memory cells. For example, the plurality of memory cells may be flash memory cells. Hereinafter, exemplary embodiments of the inventive concept will be described with respect to the plurality of memory cells which are NAND flash memory cells. However, the inventive concept is not limited thereto, and the plurality of memory cells may be resistive memory cells, such as resistive random access memory (RRAM) cells, phase-change RAM (PRAM) cells or magnetic RAM (MRAM) cells in another embodiment of the inventive concept.

The memory cell array 110 may include a plurality of NAND strings each including memory cells respectively connected to wore lines vertically stacked on a substrate. As described above, in an embodiment of the inventive concept, the memory cell array 110 may be a three-dimensional (3D) memory array. The 3D memory array is monolithically formed in one or more physical levels of arrays of memory cells having an active area disposed above a silicon substrate and circuitry associated with the operation of those memory cells. Such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; and 8,559,235; and US Pat. Pub. No. 2011/0233648. Also, US Pat. Pub. Nos. 2012/0051138 and 2011/0204420 are incorporated herein by reference.

The control logic 120 may generate an erase control signal for controlling voltage change point times in a unit of at least one word line in an erase interval. Here, a voltage applied to word lines connected to memory cells increase at the voltage change point times, and an erase operation is performed on the memory cells. According to the present embodiment, a first voltage may be applied to the word lines in the erase interval for an effective erasing execution time, and a second voltage may be applied to at least some word lines among the word lines when the effective erasing execution time elapses. Here, the second voltage is higher than the first voltage.

In the erase interval, a high voltage of about 20 V may be applied to the substrate or a well region of the substrate, and the first voltage which is a low voltage of about 0 V may be applied to the word lines. Thus, electrons stored in a charge storage layer of each of the memory cells are discharged to the substrate or the well region of the substrate and thus the erase operation may be performed on the memory cells. According to the present embodiment, when a voltage applied to the word lines is increased from the first voltage to the second voltage in the erase interval, an erase potential applied to the memory cells is lowered and thus performing of the erase operation on the memory cells may be substantially stopped.

Figure 2:
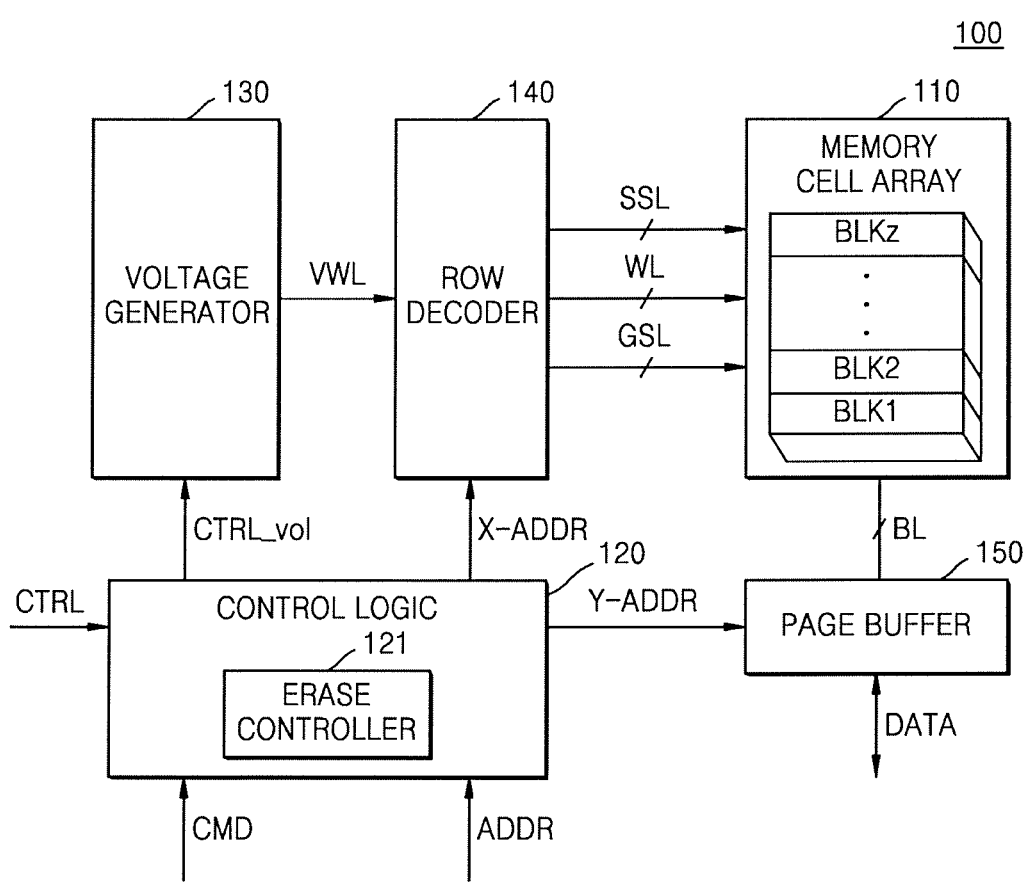
FIG. 2 is a detailed block diagram of a memory device of FIG. 1.

FIG. 2 is a detailed block diagram of the memory device 100 of FIG. 1.

Referring to FIG. 2, the memory device 100 may include the memory cell array 110, the control logic 120, a voltage generator 130, a row decoder 140, and a page buffer 150. Although not shown, the memory device 100 may further include a data input/output (I/O) circuit or an I/O interface.

The memory cell array 110 may include a plurality of memory cells, and be connected to word lines WL, string selection lines SSL, ground selection lines GSL, and bit lines BL. For example, the memory cell array 110 may be connected to the row decoder 140 via the word lines WL, the string selection lines SSL, and the ground selection lines GSL, and connected to the page buffer 150 via the bit lines BL.

The memory cell array 110 may include a plurality of blocks BLK1 to BLKz each of which has a 3D structure (or a vertical structure). For example, each of the plurality of blocks BLK1 to BLKz includes structures extending in first to third directions. For example, each of the plurality of blocks BLK1 to BLKz includes a plurality of NAND strings extending in the third direction. The plurality of NAND strings may be spaced apart from each other at a specific distance in the first and second directions. The blocks BLK1 to BLKz may be selected by the row decoder 140. For example, the row decoder 140 may select a block corresponding to a block address among the blocks BLK1 to BLKz.

The memory cell array 110 may include at least one of single-level cell blocks including single-level cells, multi-level cell blocks including multi-level cells, and triple-level cell blocks including triple-level cells. For example, some blocks among the blocks BLK1 to BLKz included in the memory cell array 110 may be single-level cell blocks and the other blocks may be multi-level cell blocks or triple-level cell blocks.

The control logic 120 may output various control signals for writing data to or reading data from the memory cell array 110 or erasing data stored in the memory cell array 110, based on a command CMD, an address ADDR, and a control signal CTRL received from the memory controller 200. Thus, the control logic 120 may control various operations in the memory device 100.

The various control signals output from the control logic 120 may be provided to the voltage generator 130, the row decoder 140, and the page buffer 150. For example, the control logic 120 may provide the voltage generator 130 with a voltage control signal CTRL_vol, provide the row decoder 140 with a row address X-ADDR, and provide the page buffer 150 with a column address Y-ADDR. However, the inventive concept is not limited thereto and the control logic 120 may provide other control signals to the voltage generator 130, the row decoder 140, and the page buffer 150.

In the present embodiment, the control logic 120 may include an erase controller 121. The erase controller 121 may determine an effective erasing execution time in a unit of at least one word line, based on the distances between the substrate and the word lines. Here, the term "effective erasing execution time" means a time during which the erase operation is respectively substantially performed on the memory cells in the erase interval. In one exemplary embodiment, an effective erasing execution time may be understood as a time during which the first voltage is applied to the word lines.

In some exemplary embodiments, the erase controller 121 may determine an effective erasing execution time in a unit of at least one word line beforehand, and store information regarding the determined effective erasing execution times. In one exemplary embodiment, the information regarding an effective erasing execution time determined in a unit of at least one word line may be stored in a latch or a register included in the control logic 120. In one exemplary embodiment, the information regarding an effective erasing execution time determined in a unit of at least one word line may be stored in a region of the memory cell array 110.

Then, the erase controller 121 may generate an erase control signal for increasing a voltage, which is applied to the word lines, from the first voltage to the second voltage at voltage change time points when the determined effective erasing execution times end. Here, the erase control signal may include information regarding the first voltage, the second voltage, and the voltage change time points. The erase controller 121 may provide the erase control signal to the voltage generator 130. In this case, the erase control signal may be provided to the voltage generator 130 as a part of the voltage control signal CTRL_vol.

In some exemplary embodiments, the erase controller 121 may generate the erase control signal in response to an erase command received from the memory controller 200. For example, the erase controller 121 may search for the information regarding the effective erasing execution time in a unit of at least one word line and generate the erase control signal for increasing a voltage to be applied to the word lines at different voltage change time points in the unit of the at least one word line, based on the searched information, in response to the erase command. However, the inventive concept is not limited thereto, and the erase controller 121 may determine an effective erasing execution time in a unit of at least one word line in response to the erase command received from the memory controller 200 and generate the erase control signal based on the determined effective erasing execution time in some exemplary embodiments.

In some exemplary embodiments, the erase controller 121 may generate the erase control signal such that a word line erase voltage, which is a voltage applied to a word line in an erase interval, increased from the first voltage to the second voltage is provided to all of memory cells to be erased in the erase interval. In some exemplary embodiments, the erase controller 121 may generate the erase control signal such that the word line erase voltage increased from the first voltage to the second voltage is provided to some of the memory cells to be erased in the erase interval.

The erase controller 121 may control the voltage generator 130, the row decoder 140, and the page buffer 150 according to the erase control signal. For example, the erase control signal may be provided to the voltage generator 130 as a part of the voltage control signal CTRL_vol. In the present embodiment, the erase controller 121 may determine the word line erase voltage to be provided to the word lines and a substrate erase voltage to be provided to the substrate, and generate the erase control signal according to the word line erase voltage and the substrate erase voltage. Also, the erase controller 121 may determine selection voltages to be applied to a string selection line and a ground selection line in the erase interval, and further generate an erase control signal according to the selected selection voltages.

The voltage generator 130 may generate various types of voltages for performing a program operation, a read operation, and an erase operation on the memory cell array 110, based on the voltage control signal CTRL_vol. For example, the voltage generator 130 may generate a word line voltage VWL, e.g., a program voltage (or a write voltage), a pre-program voltage, a read voltage, a program-inhibit voltage, a read-inhibit voltage, an erase-verify voltage, a program-verify voltage, etc. The voltage generator 130 may further generate a string selection line voltage VSSL and a ground selection line voltage VGSL, based on the voltage control signal CTRL_vol. Also, the voltage generator 130 may further generate a substrate-erase voltage VSE to be applied to the memory cell array 110.

In the present embodiment, the voltage generator 130 may generate first and second voltages which are different voltages, based on the voltage control signal CTRL_vol corresponding to the erase control signal. The voltage generator 130 may apply the first voltage to the word lines for the effective erasing execution times, and apply the second voltage to the word lines at voltage change time points after the effective erasing execution times end. For example, the voltage generator 130 may include a plurality of voltage generators to generate a plurality of voltages or may generate a plurality of voltages using a voltage divider or according to a voltage division method.

The row decoder 140 may select some of the word lines WL in response to a row address X-ADDR received from the control logic 120. For example, during the erase operation, the row decoder 140 may sequentially apply the word line erase voltages, i.e., the first voltage and the second voltage, to at least some of the selected word lines. Also, the row decoder 140 may select some of the string selection lines SSL or some of the ground selection lines GSL, in response to the row address X-ADDR received from the control logic 120.

The page buffer 150 may be connected to the memory cell array 110 via the bit lines BL, and select some of the bit lines BL in response to the column address Y-ADDR received from the control logic 120. For example, during a read operation, the page buffer 150 may act as a sense amplifier and sense data DATA stored in the memory cell array 110. During a program operation, the page buffer 150 may act as a write driver and input data DATA, which is to be stored, to the memory cell array 110.

Figure 3:
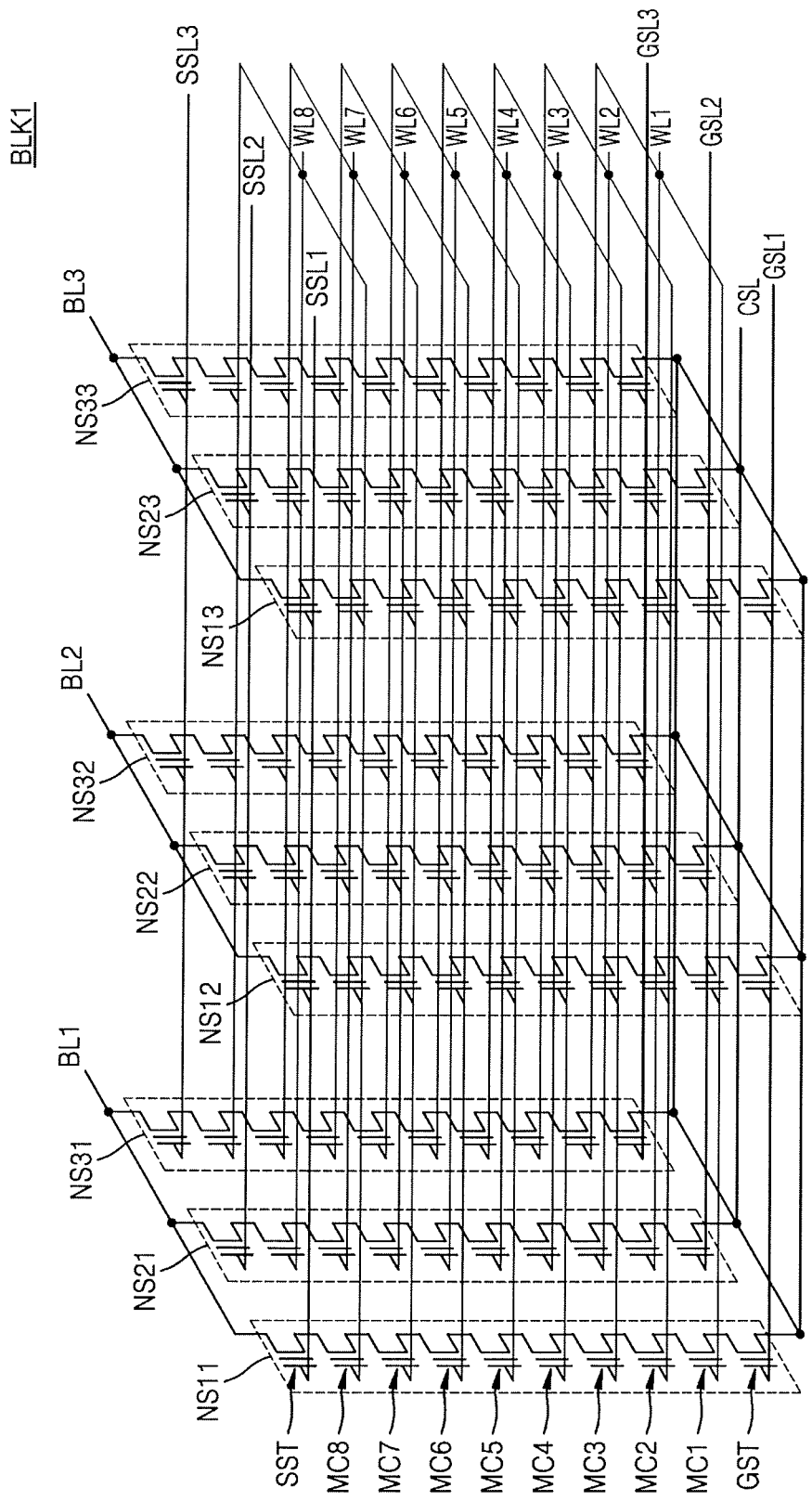
FIG. 3 is a circuit diagram of an equivalent circuit of a first block which is one of blocks of FIG. 2.

FIG. 3 is a circuit diagram of an equivalent circuit of the first block BLK1 of FIG. 2.

Referring to FIG. 3, the first block BLK1 may be a vertical NAND flash memory and the blocks BLK1 to BLKz of FIG. 2 may be embodied as illustrated in FIG. 3. The first block BLK1 may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. Here, the number of the NAND strings, the number of the word lines, the number of the bit lines, the number of the ground selection lines, and the number of the string selection lines may vary according to an embodiment.

The NAND strings NS11, NS21, and NS31 are provided between the first bit line BL1 and the common source line CSL. The NAND strings NS12, NS22, and NS32 are provided between the second bit line BL2 and the common source line CSL. The NAND strings NS13, NS23, and NS33 are provided between the third bit line BL3 and the common source line CSL. Each of the NAND strings NS11, NS21, and NS31, for example, the NAND string NS11, may include a string selection transistor SST, a plurality of memory cells MC1 to MC8, and a ground selection transistor GST that are connected in series. Hereinafter, for convenience of explanation, a NAND string will be referred to simply as a string.

Strings commonly connected to one bit line form one column together. For example, the strings NS11, NS21, and NS31 commonly connected to the first bit line BL1 may correspond to a first column, the strings NS12, NS22, and NS32 commonly connected to the second bit line BL2 may correspond to a second column, and the strings NS13, NS23, and NS33 commonly connected to the third bit line BL3 may correspond to a third column.

Strings connected to one string selection line form one row together. For example, the strings NS11, NS12, and NS13 connected to the first string selection line SSL1 may correspond to a first row, the strings NS21, NS22, and NS23 connected to the second string selection line SSL2 may correspond to a second row, and the strings NS31, NS32, and NS33 connected to the third string selection line SSL3 may correspond to a third row.

The string selection transistor SST is connected to the string selection lines SSL1 to SSL3 corresponding thereto. The plurality of memory cells MC1 to MC8 are respectively connected to the word lines WL1 to WL8 corresponding thereto. The ground selection transistor GST is connected to the ground selection lines GSL1 to GSL3 corresponding thereto. The string selection transistor SST is connected to the bit lines BL1 to BL3 corresponding thereto, and the ground selection transistor GST is connected to the common source line CSL.

In the present embodiment, word lines having the same height, e.g., the word line WL1, are connected to each other, the string selection lines SSL1 to SSL3 are separated from one another, and the ground selection lines GSL1 to GSL3 are separated from one another. For example, when memory cells connected to the first word line WL1 and belonging to the strings NS11, NS12, and NS13 are programmed, the first word line WL1 and the first string selection line SSL1 are selected. However, the inventive concept is not limited thereof, and the ground selection lines GSL1 to GSL3 may be connected to one another in another exemplary embodiment.

Figure 4:
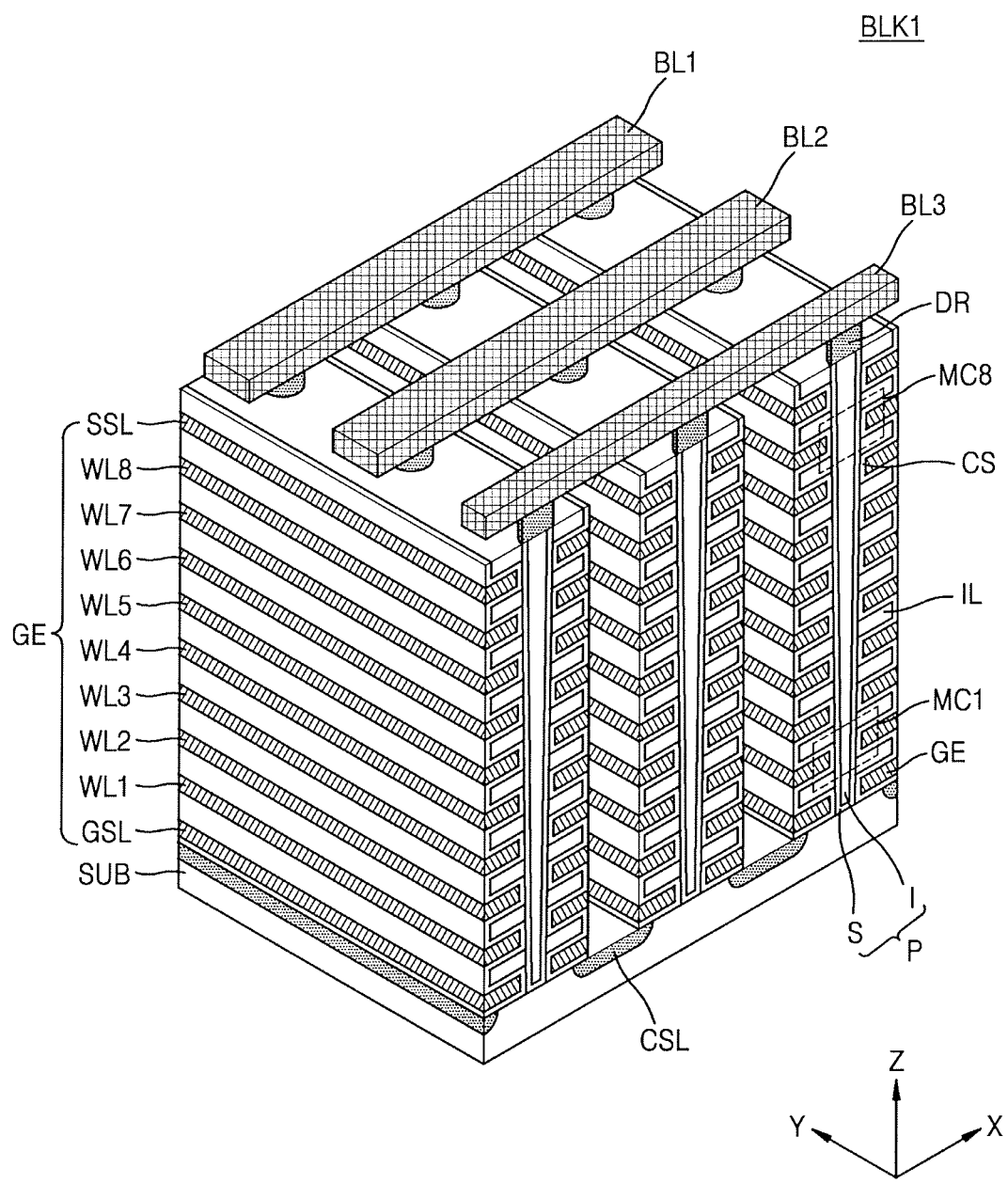
FIG. 4 is a perspective view of an example of the first block which is one of the blocks of FIG. 2.

FIG. 4 is a perspective view of an example of the first block BLK1 which is one of the blocks of FIG. 2.

Referring to FIG. 4, the first block BLK1 is formed perpendicular to the substrate SUB. In FIG. 4, the first block BLK1 includes two selection lines GSL and SSL, eight word lines WL1 to WL8, and three bit lines BL1 to BL3, but the number of selection lines, the number of word lines, and the number of bit lines are not limited thereto.

The substrate SUB is a first conductive type (e.g., a p type) substrate. Common source lines CSL extending in a first direction (e.g., a Y-axis direction) and doped with second conductive type (e.g., n type) impurities are provided on the substrate SUB. A plurality of insulating films IL extending in the first direction are sequentially provided on a region of the substrate SUB between two adjacent common source lines CSL in a third direction (e.g., a Z-axis direction). The plurality of insulating films IL are spaced a specific distance in the third direction. For example, the plurality of insulating films IL may include an insulating material such as a silicon oxide.

A plurality of pillars P that are sequentially arranged in the first direction and that pass through the plurality of insulating films IL in the third direction are provided on a region of the substrate SUB between two adjacent common source lines CSL. For example, the plurality of pillars P may pass through the plurality of insulating films IL to be in contact with the substrate SUB. For example, a surface layer S of each of the plurality of pillars P may include a first-type silicon material and act as a channel region. An internal layer I of each of the plurality of pillars P may include an insulating material such as a silicon oxide or an air gap.

A charge storage layer CS is provided on exposed surfaces of the insulating films IL, the pillars P, and the substrate SUB in a region between two adjacent common source lines CSL. The charge storage layer CS may include a gate insulating layer (which may be also referred to as a 'tunneling insulating layer'), a charge trapping layer, and a blocking insulating layer. For example, the charge storage layer CS may have an oxide-nitride-oxide (ONO) structure. Also, a gate electrode GE, such as the selection lines GSL and SSL and the word lines WL1 to WL8, is provided on an exposed surface of the charge storage layer CS in a region between two adjacent common source lines CSL.

Drains or drain contacts DR are respectively provided on the plurality of pillars P. For example, the drains or drain contacts DR may include a silicon material doped with second conductive type impurities. The bit lines BL1 to BL3 extending in a second direction (e.g., an X-axis direction) and spaced a specific distance in the first direction are provided on the drains DR.

Figure 5A:
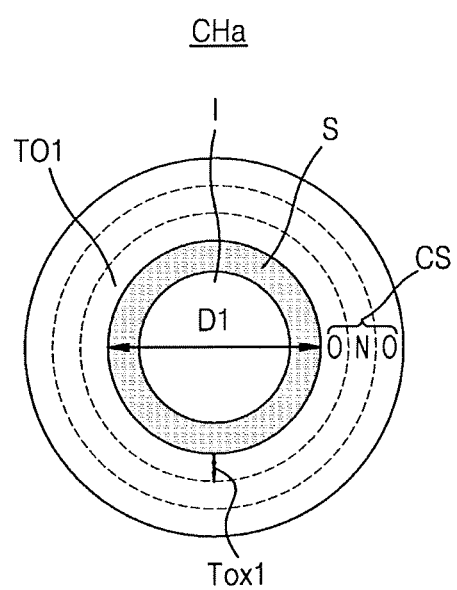
FIG. 5A is a cross-sectional view of a first channel hole corresponding to a first memory cell of FIG. 4.
Figure 5B:
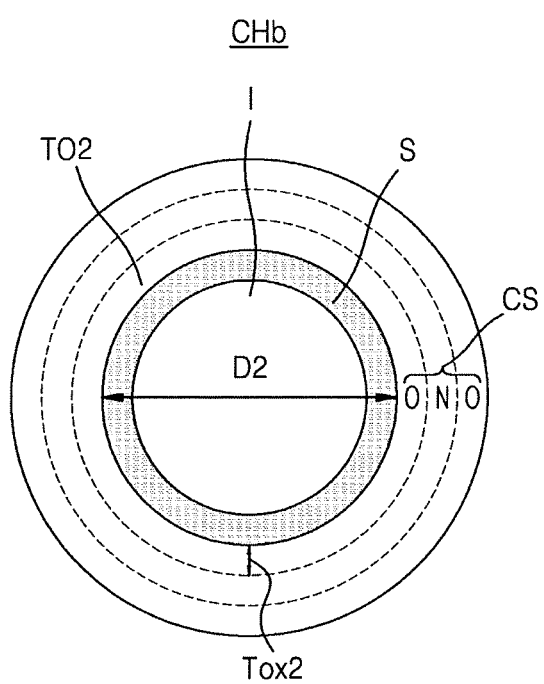
FIG. 5B is a cross-sectional view of a second channel hole corresponding to an eighth memory cell of FIG. 4.

FIG. 5A is a cross-sectional view of a first channel hole CHa corresponding to the first memory cell MC1 of FIG. 4. FIG. 5B is a cross-sectional view of a second channel hole CHb corresponding to the eighth channel hole MC8 of FIG. 4.

Referring to FIGS. 4 and 5A, a pillar P including a surface layer S and an internal layer I may be formed in the first channel hole CHa and a charge storage layer CS may be formed on a circumferential surface of the first channel hole CHa. The charge storage layer CS may have an ONO structure. In this case, the diameter of the first channel hole CHa may be 'D1', and the thickness of a first tunneling insulating layer TO1 formed on a circumferential surface of the surface layer S is 'Tox1'.

Referring to FIGS. 4 and 5B, a pillar P including a surface layer S and an internal layer I may be formed in the second channel hole CHb, and a charge storage layer CS may be formed on a circumferential surface of the second channel hole CHb. The charge storage layer CS may have an ONO structure. In this case, the diameter of the second channel hole CHb is 'D2', and the thickness of a second tunneling insulating layer TO2 formed on a circumferential surface of the surface layer S is 'Tox2'.

In some exemplary embodiments, 'D1' may be less than 'D2'. Different operating characteristics of memory cells caused by different diameters of channel holes will be described with reference to FIGS. 4, 5A, and 5B below. In a gate-all-around type 3D memory device in which a gate electrode GE is located on a circumferential surface of a channel hole, a degree of focusing of an electric field formed from the gate electrode GE to a channel region S increases when the diameter of the channel hole is short. Thus, the speeds of performing the program operation and the erase operation on a memory cell having a channel hole having a short diameter, e.g., the first channel hole CHa, are higher than the speeds of performing the program operation and the erase operation on a memory cell having a channel hole having a long diameter, e.g., the second channel hole CHb.

In some exemplary embodiments, 'Tox1' may be less than 'Tox2'. Different operating characteristics of memory cells caused by different thicknesses of tunneling insulating layers will be described with reference to FIGS. 4, 5A and 5B below. The thicknesses and composition ratios of various layers that constitute the charge storage layer CS between the gate electrode GE and the channel region S may vary according to the diameters of channel holes. When the charge storage layer CS having the ONO structure is deposited, a deposition area and deposition surface roughness of each channel hole may vary according to the diameter of the channel hole. Thus, the speed in which a deposition gas is in contact with a deposition surface of each channel hole to deposit the charge storage layer CS may vary. If a tunneling insulating layer is thin, a stronger electric field is formed when the same voltage is applied. Thus, the speeds of performing the program operation and the erase operation on a memory cell having a thin tunneling insulating layer, e.g., the first tunneling insulating layer TO1, are higher than the speeds of performing the program operation and the erase operation on a memory cell having a thick tunneling insulating layer, e.g., the second tunneling insulating layer TO2.

As described above, a stronger electric field is applied to a lower memory cell connected to a lower word line which is relatively adjacent to a substrate is higher than an upper memory cell, due to a relatively short diameter of a channel hole or a relatively thin tunneling insulating layer of the lower memory cell, when the same voltage is applied to the lower and upper word lines. Thus, when the erase operation is performed using the same word line erase voltage, the intensity of an electric field applied to the tunneling insulating layer included in the lower memory cell is higher than that of an electric field applied to a tunneling insulating layer included in the upper memory cell. Accordingly, since the speed of erasing the lower memory cell is higher than that of erasing the upper memory cell, the lower memory cell may be deeply erased or over-erased and thus the quality of the lower memory cell may be degraded more than that of the upper memory cell.

Figure 6:
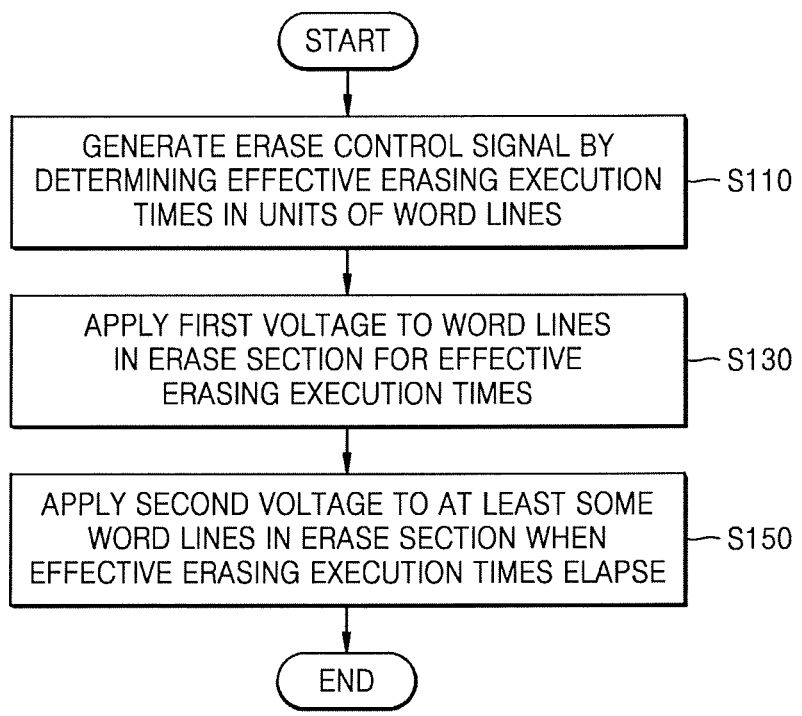
FIG. 6 is a flowchart of a method of erasing a memory device according to an exemplary embodiment of the present inventive concept.

FIG. 6 is a flowchart of a method of erasing a memory device according to an exemplary embodiment of the present inventive concept.

The method of FIG. 6 according to the inventive concept may include operations that are sequentially performed by a memory device, e.g., the memory device 100 of FIG. 2. The above description with respect to FIGS. 1 to 5B may also apply to the present embodiment and is thus not redundantly described here.

In operation S110, an erase control signal is generated by determining an effective erasing execution time in a unit of at least one word line. For example, the erase controller 121 may determine the effective erasing execution time in the unit of the at least one word line based on the distances between a substrate and the word lines, and generate the erase control signal to increase a voltage applied to the word lines from a first voltage to a second voltage at voltage change time points according to the effective erasing execution times.

In operation S130, the first voltage is applied to the word lines in an erase interval for the effective erasing execution times. For example, the first voltage may be applied to a first word line adjacent to the substrate for a first effective erasing execution time, and the first voltage may be applied to a second word line located on the first word line for a second effective erasing execution time. In one exemplary embodiment, the first effective erasing execution time may be shorter than the second effective erasing execution time.

In operation S150, the second voltage is applied to at least some word lines among the word lines in the erase interval when the effective erasing execution times elapse. For example, the second voltage may be applied to the first word line adjacent to the substrate at a first voltage change time point, and applied to the second word line on the first word line at a second voltage change time point. In one exemplary embodiment, the first voltage change time point may be earlier than the second voltage change time point.

Figure 7:
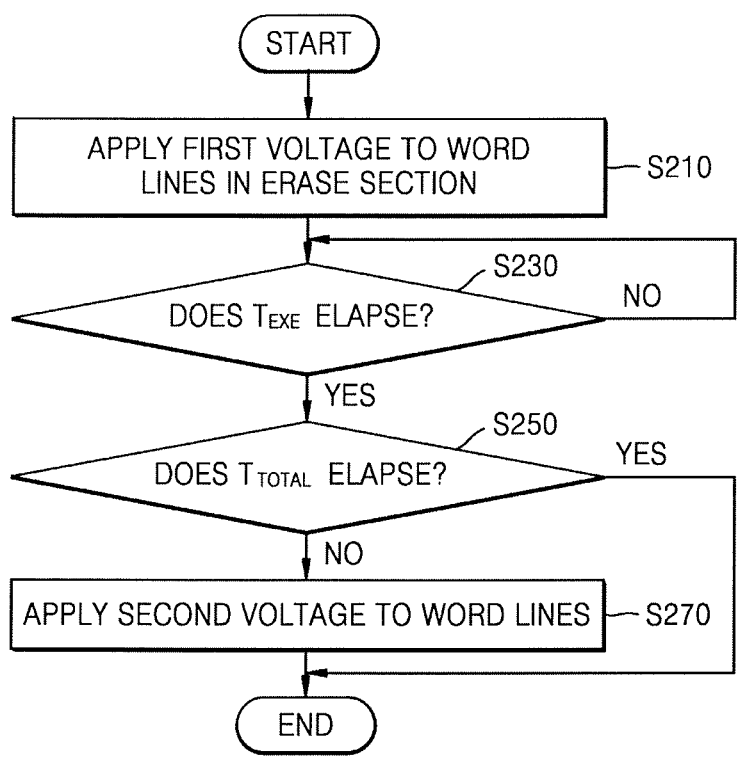
FIG. 7 is a flowchart of a method of erasing a memory device according to an exemplary embodiment of the present inventive concept.

FIG. 7 is a flowchart of a method of erasing a memory device according to an exemplary embodiment of the present inventive concept.

The method of FIG. 7 according to the present embodiment may be a detailed embodiment of operations S130 and S150 included in the method of FIG. 6. Thus, the above description with respect to FIG. 6 may also apply to the present embodiment.

In operation S210, a first voltage is applied to word lines in an erase interval. In one exemplary embodiment, the erase operation may be performed in a unit of a block and the first voltage may be applied to word lines connected to blocks to be erased. In one exemplary embodiment, the erase operation may be performed in a unit of a sub-block and the first voltage may be applied to word lines connected to sub-blocks to be erased.

In operation S230, it is determined whether an effective erasing execution time $T_{EXE}$ elapses. Here, the effective erasing execution time $T_{EXE}$ may be less than or equal to a total erasing time $T_{TOTAL}$. When it is determined that the effective erasing execution time $T_{EXE}$ elapses, operation S250 is performed. In one exemplary embodiment, the effective erasing execution time $T_{EXE}$ may be set in a unit of at least one word line so that each unit of at least one word line may have a different effective erasing execution time $T_{EXE}$ from other units. For example, if at least one word line is one word line, each word line has a different effective erasing execution time $T_{EXE}$ from other word lines. For example, if at least one word line is a word line group including two or more word lines, each word line group has a different effective erasing execution time $T_{EXE}$ from other word line groups. The total erasing time $T_{TOTAL}$ may be referred to as an erasing time necessary to erase a block or a sub-block.

In operation S250, it is determined whether the total erasing time $T_{TOTAL}$ elapses. When it is determined that the total erasing time $T_{TOTAL}$ elapses, the erase operation is ended. When it is determined that the total erasing time $T_{TOTAL}$ does not elapse, operation S270 is performed. In one exemplary embodiment, an effective erasing execution time $T_{EXE}$ corresponding to at least one word line among the word lines may be equal to the total erasing time $T_{TOTAL}$. In this case, the second voltage need not be applied to the at least one word line and the erase operation may be ended when the total erasing time $T_{TOTAL}$ elapses.

In operation S270, the second voltage is applied to the word lines. When the effective erasing execution time $T_{EXE}$ elapses but the total erasing time $T_{TOTAL}$ does not elapse, the second voltage which is higher than the first voltage may be applied to desired word lines. Accordingly, performing of the erase operation on the memory cells connected to the word lines may be substantially stopped.

Figure 8:
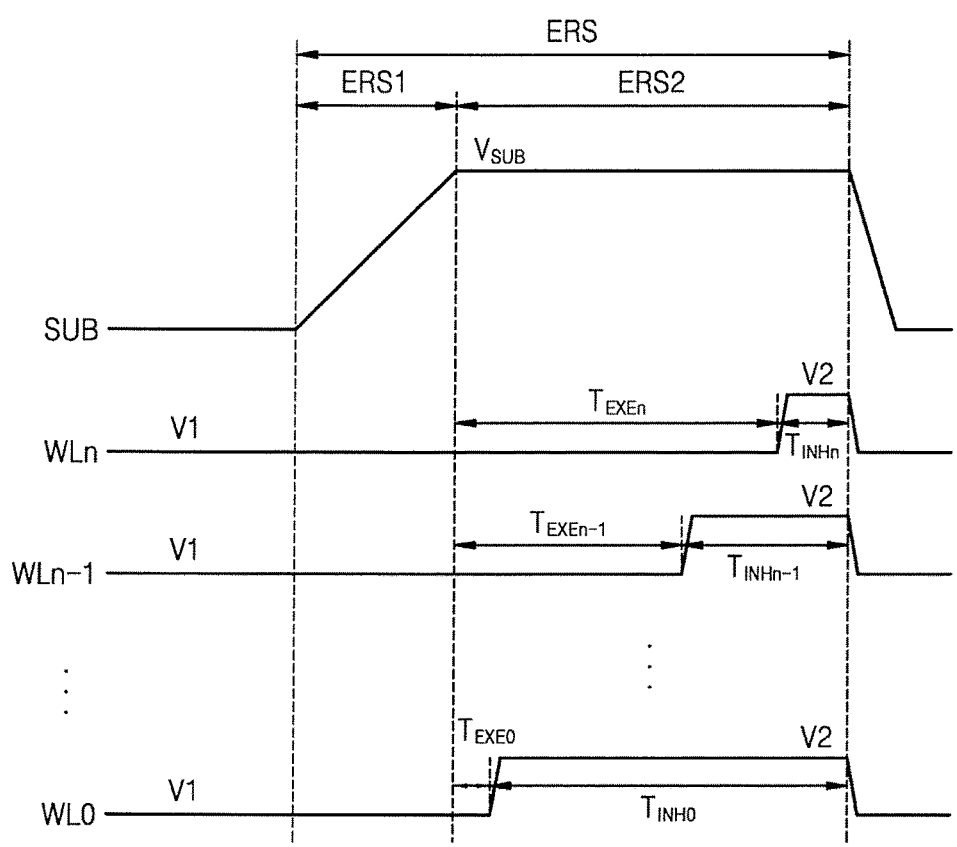
FIG. 8 illustrates graphs showing voltages applied to memory cells during an erase interval in which an erase operation is performed, according to an exemplary embodiment of the present inventive concept.

FIG. 8 illustrates graphs showing voltages applied to memory cells in an erase interval ERS in which the erase operation is performed, according to an exemplary embodiment of the present inventive concept.

Referring to FIG. 8, the erase interval ERS may be started by an erase control signal generated by a control logic (e.g., the control logic 120 of FIG. 1) of a memory device (e.g., the memory device 100 of FIG. 1), in response to an erase command received from a memory controller (e.g., the memory controller 200 of FIG. 1). The erase interval ERS may be divided into a first erase interval ERS1 and a second erase interval ERS2.

In the first erase interval ERS1, a substrate voltage applied to a substrate SUB (particularly, a well region of the substrate SUB, e.g., a P well region) increases to a substrate erase voltage $V_{SUB}$. In the first erase interval ERS1, a first voltage V1 may be applied to word lines WL0 to WLn. In this case, the first voltage V1 may approximate 0V. For example, the first voltage V1 may be about 0.3 V.

In the second erase interval ERS2, the substrate voltage applied to the substrate SUB is maintained to be equal to a substrate erase voltage $V_{SUB}$. The substrate erase voltage $V_{SUB}$ may be a high voltage, e.g., a voltage which approximates about 16 V to 20 V. In the second erase interval ERS2, the first voltage V1 may be applied to the word lines WL0 to WLn for effective erasing execution times. In one exemplary embodiment, the first voltage V1 may be determined such that the erase operation is performed on memory cells according to the difference between the substrate erase voltage $V_{SUB}$ and the first voltage V1.

Here, the term "effective erasing execution time" may be understood a time period from a starting point of the second erase interval ERS2 to a voltage change time point. In the present embodiment, the effective erasing execution times corresponding to the word lines WL0 to WLn may be shorter than the length of the second erase interval ERS2. However, the inventive concept is not limited thereto, and an effective erasing execution time corresponding to some word lines among the word lines WL0 to WLn may be equal to the length of the second erase interval ERS2 in some exemplary embodiments.

According to the present embodiment, the effective erasing execution times corresponding to the word lines may be different from one another. In some exemplary embodiments, an effective erasing execution time corresponding to a lower word line adjacent to the substrate may be shorter than an effective erasing execution time corresponding to an upper word line. For example, the first voltage V1 may be applied to a word line WL0 for a first effective erasing execution time $T_{EXE0}$, applied to a word line WLn-1 for a $(n-1)^{th}$ effective erasing execution time $T_{EXEn-1}$, and applied to a word line WLn for an $n^{th}$ effective erasing execution time $T_{EXEn}$. In this case, the $n^{th}$ effective erasing execution time $T_{EXEn}$ may be longer than the $(n-1)^{th}$ effective erasing execution time $T_{EXEn-1}$, and the $(n-1)^{th}$ effective erasing execution time $T_{EXEn-1}$ may be longer than the first effective erasing execution time $T_{EXE0}$.

In the second erase interval ERS2, a second voltage V2 may be applied to the word lines WL0 to WLn for erasing-prohibited times after the voltage change time point. The second voltage V2 may be any voltage level greater than the first voltage V1. For example, the second voltage V2 may be about 1 to 2 V. In one exemplary embodiment, the second voltage V2 may be determined such that the erase operation is to not be substantially performed on memory cells according to the difference between the substrate erase voltage $V_{SUB}$ and the second voltage V2, which is greater than first voltage V1.

Here, the erasing-prohibited times may be time periods from a voltage change time point to an ending point of the second erase interval ERS2. In the present embodiment, the erasing-prohibited times corresponding to the word lines WL0 to WLn may be greater than '0' and shorter than the length of the second erase interval ERS2. However, the inventive concept is not limited thereto, and an erasing-prohibited time corresponding to some of the word lines WL0 to WLn may be '0' in some exemplary embodiments. For example, the $n^{th}$ effective erasing execution time $T_{EXEn}$ of the $n^{th}$ word line WLn may be substantially equal to the second erase interval ERS2 so that the second voltage V2 need not be applied to memory cells connected to the $n^{th}$ word line WLn. In this case, the $n^{th}$ effective erasing execution time $T_{EXEn}$ may be substantially equal to the total erasing time $T_{TOTAL}$ or a sum of an effective erasing execution time and an erasing-prohibited time for an word line which is subject to the first voltage V1 and the second voltage V2.

According to the present embodiment, the erasing-prohibited times corresponding to the word lines may be different from one another. In some exemplary embodiments, an erasing-prohibited time corresponding to a lower word line adjacent to the substrate may be longer than that corresponding to an upper word line. For example, the second voltage V2 may be applied to the word line WL0 for a first erasing-prohibited time $T_{INH0}$, applied to the word line WLn–1 for an $(n-1)^{th}$ erasing-prohibited time $T_{INHn-1}$, and applied to the word line WLn for an $n^{th}$ erasing-prohibited time $T_{INHn}$. In this case, the $n^{th}$ erasing-prohibited time $T_{INHn}$ may be shorter than the $(n-1)^{th}$ erasing-prohibited time $T_{INHn-1}$ and the $(n-1)^{th}$ erasing-prohibited time $T_{INHn-1}$ may be shorter than the first erasing-prohibited time $T_{INH0}$.

As described above, according to the present embodiment, an effective erasing execution time during which the erase operation is substantially performed on a memory cell connected to a lower word line may be shorter than an effective erasing execution time during which the erase operation is substantially performed on a memory cell connected to an upper word line. The diameter of channel holes of lower memory cells connected to a lower word line or the thickness of tunneling insulating layers of the lower memory cells may be less than those of an upper memory cells connected to an upper word line. Thus, the speed of erasing the lower memory cells may be higher than that of erasing the upper memory cells.

In this case, the lower memory cells may be over-erased when the same erase voltages are applied to the lower memory cells and the upper memory cells for the same erase time. However, according to the present embodiment, the lower memory cells may be prevented from being over-erased by applying a word line erase voltage to the lower word lines for a relatively short erase time. In the related art, word line erase voltages to be applied to a plurality of word lines are set to be different so as to compensate for the differences between the speeds of erasing the plurality of word lines. In this case, different word line erase voltages should be set to respectively correspond to the plurality of word lines and thus the size of a voltage generator increases. Thus, the size of or costs of manufacturing a memory device increase. In contrast, according to the present embodiment, effective erasing execution times corresponding to word lines are differently set and thus the differences between the speeds of erasing the word lines may be compensated for without increasing the size of or costs of manufacturing a memory device.

Figure 9:
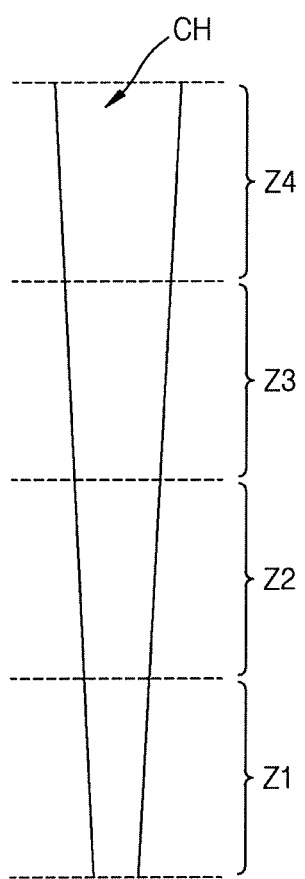
FIG. 9 illustrates a case in which NAND strings are divided into a plurality of groups according to an exemplary embodiment of the present inventive concept.

FIG. 9 illustrates a case in which NAND strings are divided into a plurality of groups according to an exemplary embodiment of the present inventive concept.

FIG. 9 illustrates a channel hole CH corresponding to one NAND string included in a 3D memory device. The channel hole CH is formed by etching some regions of gate electrodes and insulating films formed on a substrate. Thus, etching of the gate electrodes and the insulating films may become different as depths from the surfaces of the gate electrodes and the insulating films increase. Thus, the diameter of the channel hole CH may taper toward the substrate.

In one exemplary embodiment, the channel hole CH may be divided into four sections Z1 to Z4 according to the diameter thereof. In an erase interval, an initial word line erase voltage applied to word lines connected to the first to fourth sections Z1 to Z4 may be determined to be equal to a first voltage, for example, the first voltage V1 of FIG. 8. Next, a word line erase voltage applied to the word lines connected to the first to fourth sections Z1 to Z4 may be increased from the first voltage to a second voltage (e.g., the second voltage V2 of FIG. 8) at voltage change time points corresponding to the first to fourth sections Z1 to Z4.

Figure 10:
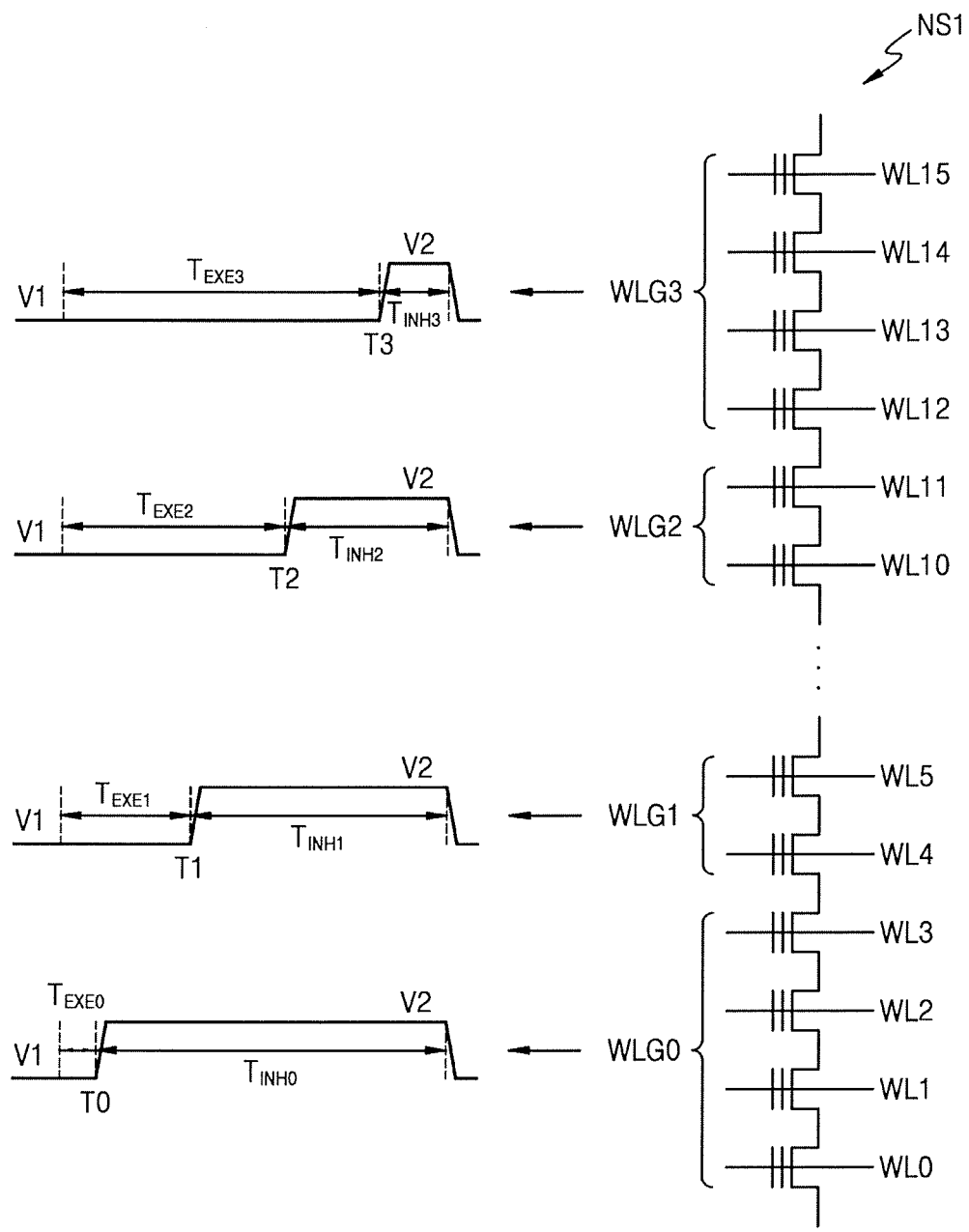
FIG. 10 illustrates word line erase voltages respectively applied to a plurality of word lines connected to a NAND string according to an exemplary embodiment of the present inventive concept.

FIG. 10 illustrates word line erase voltages respectively applied to a plurality of word lines connected to a NAND string NS1 according to an exemplary embodiment of the present inventive concept.

Referring to FIG. 10, the NAND string NS1 may include sixteen word lines WL0 to WL15 and be divided into a plurality of word line groups. For example, the first word line group WLG0 may include lower word lines WL0 to WL3 adjacent to a substrate and correspond to the first section Z1 of FIG. 9. The second word line group WLG1 may include word lines WL4 and WL5 and correspond to the second section Z2 of FIG. 9. The third word line group WLG2 may include word lines WL10 and WL11 and correspond to the third section Z3 of FIG. 9. The fourth word line group WLG3 may include word lines WL12 to WL15 and correspond to the fourth section Z4 of FIG. 9. However, the inventive concept is not limited thereto, and the NAND string NS1 may include word lines, the total number of which is less than or greater than sixteen and be divided into word line groups, the total number of which is less than or greater than four.

A first effective erasing execution time $T_{EXE0}$ corresponding to the first word line group WLG0 may be shortest, a first voltage change time point T0 may be earliest, and a first erasing-prohibited time $T_{INH0}$ may be longest. In one exemplary embodiment, the first effective erasing execution time $T_{EXE0}$ may be shorter than the first erasing-prohibited time $T_{INH0}$. The inventive concept is not limited thereto. In one exemplary embodiment, the first effective erasing execution time $T_{EXE0}$ may be longer than the first erasing-prohibited time $T_{INH0}$. In one exemplary embodiment, the first effective erasing execution time $T_{EXE}$ may vary according to a program/erase cycle count or a data retention time.

A second effective erasing execution time $T_{EXE1}$ corresponding to the second word line group WLG1 may be longer than the first effective erasing execution time $T_{EXE0}$, a second voltage change time point T1 may be later than the first voltage change time point T0, and a second erasing-prohibited time $T_{INH1}$ may be shorter than the first erasing-prohibited time $T_{INH0}$. In one exemplary embodiment, the second effective erasing execution time $T_{EXE1}$ may be determined to be any time period which is longer than the first effective erasing execution time $T_{EXE0}$.

A third effective erasing execution time $T_{EXE2}$ corresponding to the third word line group WLG2 may be longer than the second effective erasing execution time $T_{EXE1}$, a third voltage change time point T2 may be later than the second voltage change time point T1, and a third erasing-prohibited time $T_{INH2}$ may be shorter than the second erasing-prohibited time $T_{INH1}$. In one exemplary embodiment, the third effective erasing execution time $T_{EXE2}$ may be determined to be any time period which is longer than the second effective erasing execution time $T_{EXE1}$.

A fourth effective erasing execution time $T_{EXE3}$ corresponding to the fourth word line group WLG3 may be longer than the third effective erasing execution time $T_{EXE2}$, a fourth voltage change time point T3 may be later than the third voltage change time point T2, and the fourth erasing-prohibited time $T_{INH3}$ may be shorter than the third erasing-prohibited time $T_{INH2}$. In one exemplary embodiment, the fourth effective erasing execution time $T_{EXE3}$ may be determined to be any time period which is longer than the third effective erasing execution time $T_{EXE2}$. In one exemplary embodiment, the fourth effective erasing execution time $T_{EXE3}$ may be shorter than the fourth erasing-prohibited time $T_{INH3}$ but the inventive concept is not limited thereto. In one exemplary embodiment, the fourth effective erasing execution time $T_{EXE3}$ may be longer than the fourth erasing-prohibited time $T_{INH3}$.

According to the present embodiment, voltage change time points for the plurality of word line groups may be different, the same first voltage may be applied for effective erasing execution times regardless of the plurality of word line groups, and the same second voltage may be applied for erasing-prohibited times regardless of the plurality of word line groups. Thus, a time during which the erase operation is substantially performed on lower memory cells erased within a short time may be set to be relatively short regardless of the different diameters of channel holes or different thicknesses of tunneling insulating layers in the NAND string NS1, thereby preventing the lower memory cells from being over-erased. Thus, after the erase operation is completed, threshold voltages of all of the memory cells included in the NAND string NS1 may be changed to be in a distribution range corresponding to an erase state.

Figure 11:
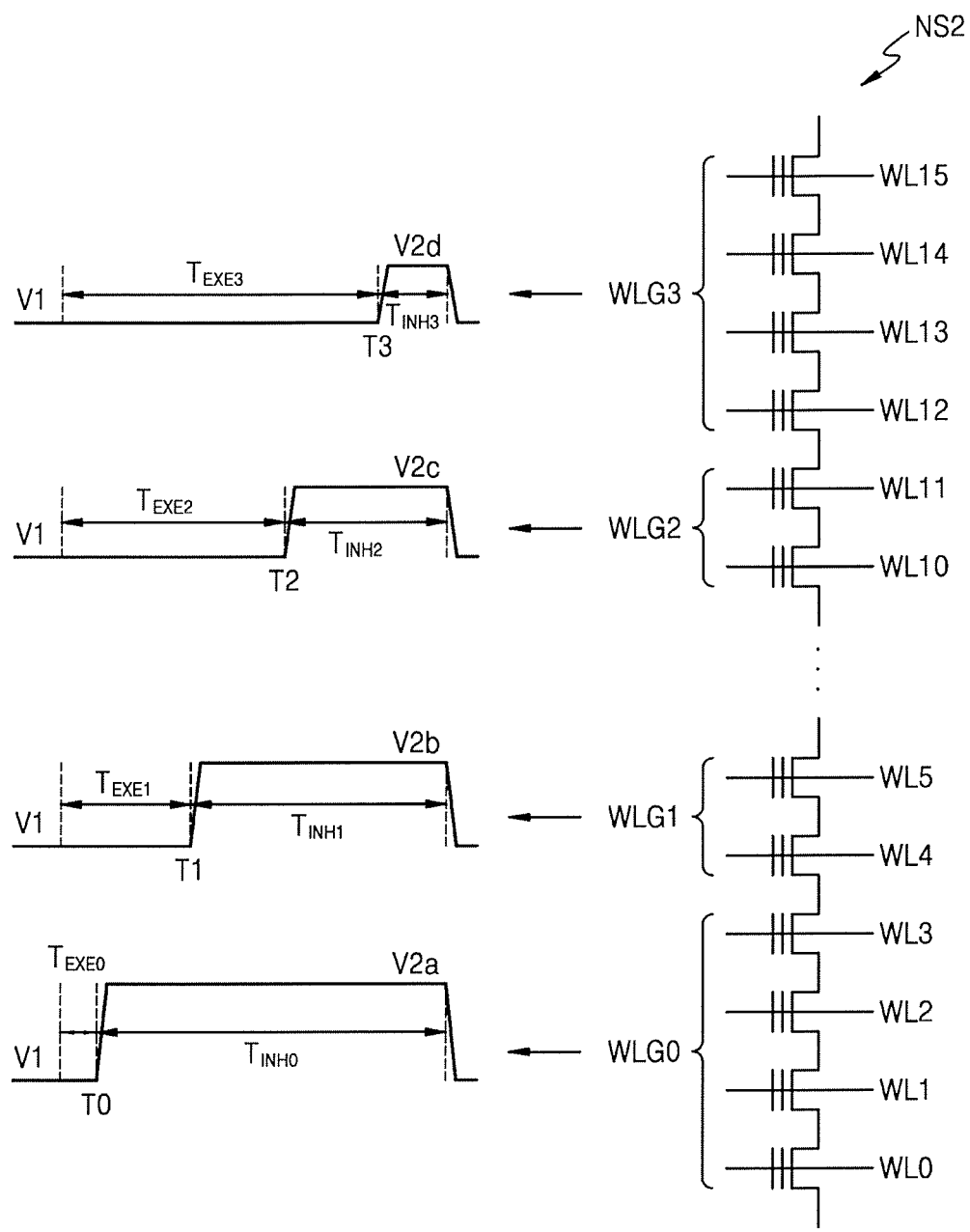
FIG. 11 illustrates word line erase voltages respectively applied to a plurality of word lines connected to a NAND string according to an exemplary embodiment of the present inventive concept.

FIG. 11 illustrates word line erase voltages respectively applied to a plurality of word lines connected to a NAND string NS2 according to an embodiment of the inventive concept.

Referring to FIG. 11, the NAND string NS2 may include sixteen word lines WL0 to WL15 and be divided into a plurality of word line groups. A method of applying a word line erase voltage according to the present embodiment may be a modified example of the method described above with reference to FIG. 10. Thus, the description with reference to FIG. 10 may also apply to the present embodiment. The embodiment of FIG. 11 will be described focusing on the differences from the embodiment of FIG. 10.

A second voltage V2a corresponding to a first word line group WLG0 may be determined to be any voltage level which is greater than a first voltage V1. In one exemplary embodiment, the second voltage V2a may be determined such that performing of the erase operation on memory cells connected to word lines WL0 to WL3 included in the first word line group WLG0 is substantially stopped due to the difference between the second voltage V2a and an erase voltage applied to a substrate.

A second voltage V2b corresponding to a second word line group WLG1 may be determined to be any voltage level which is lower than the second voltage V2a corresponding to the first word line group WLG0. In one exemplary embodiment, the second voltage V2b may be determined such that performing of the erase operation on memory cells connected to word lines WL4 and WL5 included in the second word line group WLG1 is substantially stopped due to the difference between the second voltage V2b and the erase voltage applied to the substrate.

A second voltage V2c corresponding to a third word line group WLG2 may be determined to be any voltage level which is lower than the second voltage V2b corresponding to the second word line group WLG1. In one exemplary embodiment, the second voltage V2c may be determined such that performing of the erase operation on memory cells connected to word lines WL10 and WL11 included in the third word line group WLG2 is substantially stopped due to the difference between the second voltage V2c and the erase voltage applied to the substrate.

A second voltage V2d corresponding to a fourth word line group WLG3 may be determined to be any voltage level which is lower than the second voltage V2c corresponding to the third word line group WLG2. In one exemplary embodiment, the second voltage V2d may be determined such that performing of the erase operation on memory cells connected to word lines WL12 to WL15 included in the fourth word line group WLG3 is substantially stopped due to the difference between the second voltage V2d and the erase voltage applied to the substrate.

According to the present embodiment, voltage change time points for the plurality of word line groups may be different, the same first voltage may be applied for effective erasing execution times regardless of the plurality of word line groups, and different second voltages may be applied to the word lines for erasing-prohibited times regardless of the plurality of word line groups. Thus, a time during which the erase operation to be substantially performed on lower memory cells to be erased within a short time may be set to be relatively short regardless of the different diameters of channel holes or the different thicknesses of tunneling insulating layers in the NAND string NS2, thereby preventing the lower memory cells from being over-erased. Thus, after the erase operation is completed, threshold voltages of all of the memory cells included in the NAND string NS2 may be changed to be in a distribution range corresponding to an erase state.

Although not shown, in some exemplary embodiments, the second voltage V2a corresponding to the first word line group WLG0 may be lowest, and second voltages may increase from a lower word line to an upper word line. According to some exemplary embodiments, second voltages corresponding to the first to fourth word line groups WLG0 to WLG3 need not increase or decrease according to a distance to the substrate and may be different from one another regardless of the distance to the substrate.

Figure 12A:
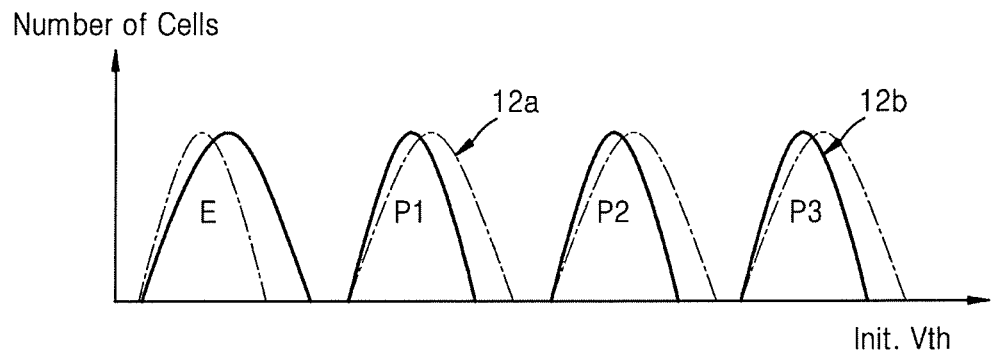
FIG. 12A is a graph showing a first distribution of threshold voltages of the memory cells.
Figure 12B:
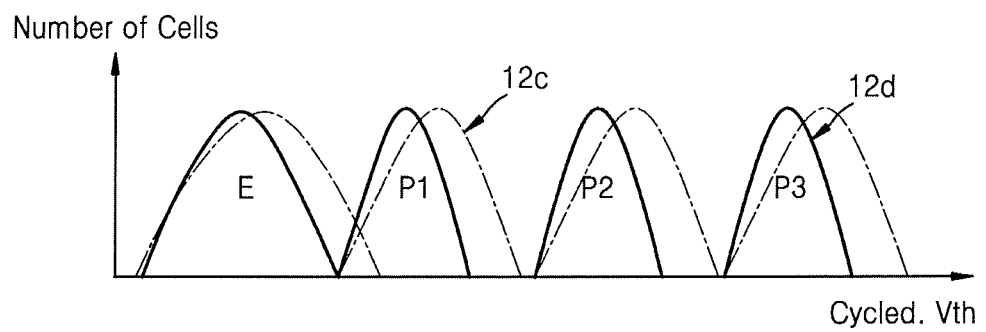
FIG. 12B is a graph showing a second distribution of threshold voltages of the memory cells.

FIG. 12A is a graph showing a first distribution of threshold voltages of the memory cells. FIG. 12B is a graph showing a second distribution of threshold voltages of the memory cells.

In FIGS. 12A and 12B, a horizontal axis denotes a threshold voltage Vth, and a vertical axis denotes the number of memory cells. For example, when a memory cell is a multi-level cell programmed to a 2-bit, the memory cell may have an erase state E, a first program state P1, a second program state P2, or a third program state P3.

The first distribution of FIG. 12A may be an initial distribution of threshold voltages of the memory cells when a program/erase cycle (P/E cycle) count is less than a threshold value. For example, the first distribution includes a distribution 12a of threshold voltages of first memory cells and a distribution 12b of threshold voltages of second memory cells. Here, the first memory cells may be understood as memory cells, the diameters of the channel holes of which are less than a reference value, and the second memory cells may be understood as memory cells, the diameters of the channel holes of which are equal to or greater than the reference value.

In some exemplary embodiments, the first memory cells may be lower memory cells which are relatively close to a substrate, and the second memory cells may be upper memory cells which are relatively far from the substrate. In some exemplary embodiments, word lines included in one block may be divided into two groups, memory cells connected to word lines included in a lower group may be the first memory cells, and memory cells connected to word lines included in an upper group may be the second memory cells.

The diameters of the channel holes of the first memory cells are relatively small and thus the speed of erasing the first memory cells is relatively high. Thus, threshold voltages of the first memory cells in the erase state E may be lower than those of the second memory cells in the erase state E. Since the diameters of the channel holes of the first memory cells are relatively small, the speed of programming the first memory cells is relatively high. Thus, threshold voltages of the first memory cells in the first program state P1 may be higher than those of the second memory cells in the first program state P1.

The second distribution illustrated in FIG. 12B may be a distribution of threshold voltages of memory cells when a program/erase cycle (P/E cycle) count is equal to or greater than a threshold value. For example, the second distribution includes a distribution 12c of threshold voltages of first memory cells and a distribution 12d of threshold voltages of second memory cells. Here, the first memory cells may be understood as memory cells, the diameter of the channel holes of which are less than the threshold value and the second memory cells may be understood as memory cells, the diameters of the channel holes of which are equal to or greater than the threshold value.

In some exemplary embodiments, the first memory cells may be lower memory cells which are relatively close to a substrate, and the second memory cells may be upper memory cells which are relatively far from the substrate. In some embodiments, word lines included in one block may be divided into two groups, memory cells connected to word lines included in a lower group may be the first memory cells, and memory cells connected to word lines included in an upper group may be the second memory cells.

The speed of erasing the first memory cells may be relatively high at an initial stage but may become relatively low as the program/erase cycle count increases. This is because the speeds of programming and erasing the first memory cells are high and thus a variation in threshold voltages thereof increases as the program/erase cycle count increases, thereby accelerating deterioration of the first memory cells. Thus, the first memory cells may not be easily erased due to electrons trapped in charge storage layers (e.g., the charge storage layer CS of FIG. 4) included in the first memory cells.

The speed of erasing the first memory cells may more increases as the program/erase cycle count increases. Upper voltages of the first memory cells in the first to third program states P1 to P3 may be more increased by electrons trapped in the charge storage layers included in the first memory cells. Thus, when the program/erase cycle count is equal to or greater than the threshold value, the upper voltages of the first memory cells in the first to third program states P1 to P3 increase and thus valleys between the first to third program states P1 to P3 may be moved to be higher.

As described above, as a program/erase cycle count increases, the speeds of erasing memory cells including channel holes having short diameters may decrease and upper voltages of the memory cells in the first to third program states P1 to P3 may increase. Thus, according to the present embodiment, when the program/erase cycle count increases, effective erasing execution times during which memory cells in the first to third program states P1 to P3 are erased may be increased and an erase control signal may be generated based on the increased effective erasing execution times, as will be described in detail with reference to FIGS. 13 and 14 below.

Figure 13:
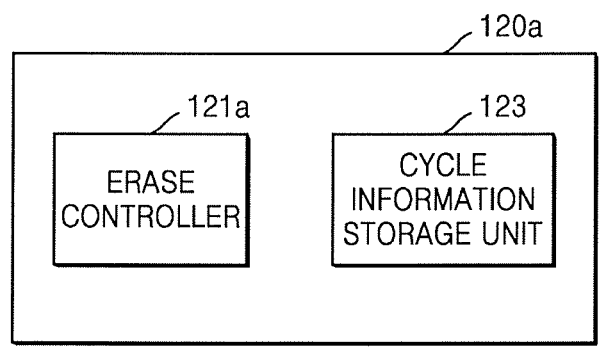
FIG. 13 is a block diagram of a control logic according to an exemplary embodiment of the present inventive concept.

FIG. 13 is a block diagram of a control logic 120a according to an exemplary embodiment of the present inventive concept.

Referring to FIG. 13, the control logic 120a may include an erase controller 121a and a cycle information storage unit 123. The control logic 120a according to the present embodiment may be a modified example of the control logic 120 of FIG. 2. The above description with reference to FIGS. 1 to 12B may also apply to the present embodiment and thus is omitted.

The cycle information storage unit 123 may store cycle information regarding a program/erase cycle count regarding the plurality of memory cells included in the memory cell array 110. Here, the program/erase cycle count means a number of times that a program/erase cycle is performed. The cycle information storage unit 123 may be embodied as a latch or a register. In one exemplary embodiment, cycle information may be stored in a region of the memory cell array 110. In some exemplary embodiments, the cycle information may be stored in a buffer memory of a memory controller 200. In some exemplary embodiments, the cycle information may be stored in an additional nonvolatile memory included in the memory system 10.

The erase controller 121a may change an effective erasing execution time determined beforehand in a unit of at least one word line, based on the cycle information, and generate an erase control signal based on the changed effective erasing execution time. For example, when an operating cycle count is less than a threshold value, the erase controller 121a may generate the erase control signal based on the determined effective erasing execution times. When the operating cycle count is equal to or greater than the threshold value, the erase controller 121a may change the effective erasing execution times to be longer than effective erasing execution times determined beforehand for the lower memory cells, and generate the erase control signal based on the changed effective erasing execution times.

Figure 14:
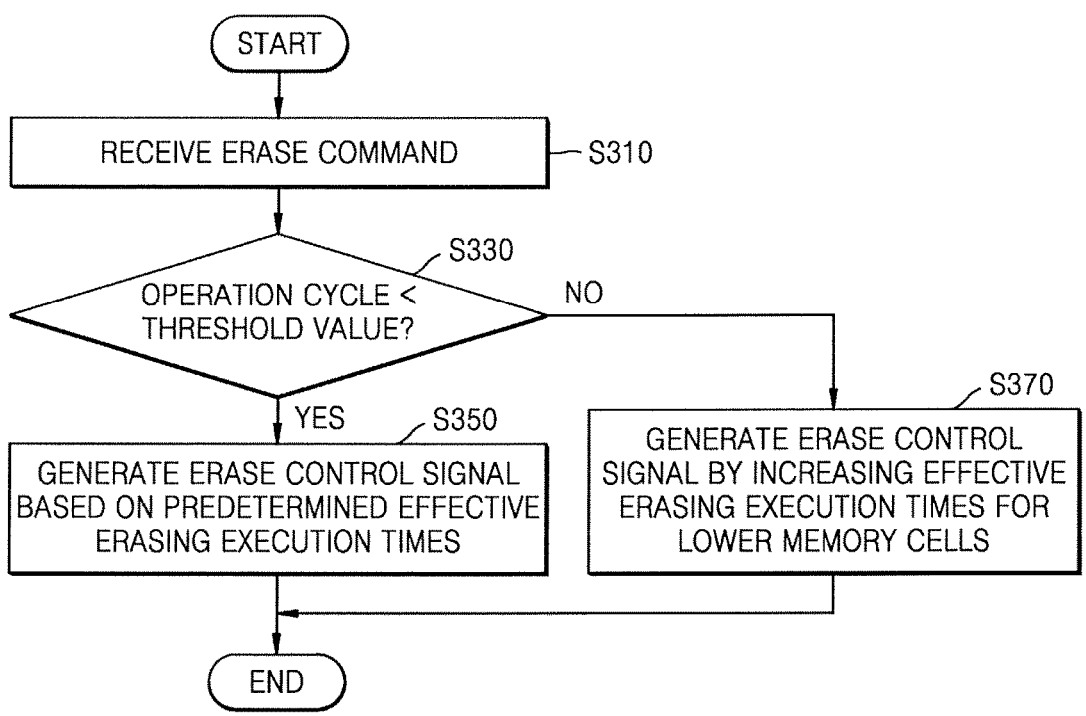
FIG. 14 is a flowchart of a method of generating an erase control signal of a memory device according to an exemplary embodiment of the present inventive concept.

FIG. 14 is a flowchart of a method of generating an erase control signal of a memory device according to an exemplary embodiment of the present inventive concept.

The method of FIG. 14 according to the present embodiment may be performed by a memory device (e.g., the memory device 100 of FIG. 1) when an erase command is received from a memory controller (e.g., the memory controller 200 of FIG. 1). For example, the method according to the present embodiment may include operations that are sequentially performed by, for example, the control logic 120*a* of FIG. 13.

In operation S310, an erase command is received. For example, the control logic 120*a* may receive the erase command from the memory controller 200. However, the inventive concept is not limited thereto, and a command (e.g., a pre-program command, etc.) for preparing the erase operation may be received from the memory controller 200 to perform the following operations in some exemplary embodiments. For example, before the erase operation is substantially performed, the following operations may be performed beforehand to generate the erase control signal.

In operation S330, it is determined whether an operation cycle is less than a threshold value. In one exemplary embodiment, the operation cycle may correspond to a program/erase operation cycle count. Operation S350 is performed when it is determined that the operation cycle is less than the threshold value. Operation S370 is performed when it is determined that the operation cycle is equal to or greater than the threshold value. However, the inventive concept is not limited thereto, and it may be determined in operation S330 whether the operation cycle is less than threshold value, operation S350 may be performed when the operation cycle is less than the threshold value, and operation S370 may be performed when the operation cycle is greater than the threshold value.

In operation S350, an erase control signal is generated based on predetermined effective erasing execution times. When the operation cycle is less than the threshold value, memory cells may have a distribution of threshold voltages as illustrated in FIG. 12A. As in operation S110 of FIG. 6, an erase controller (e.g., the erase controller 121 of FIG. 2) may determine effective erasing execution times beforehand such that effective erasing execution times for lower memory cells are relatively short. In this case, operation S110 may be performed before the erase command is received, and information regarding the determined effective erasing execution times may be stored. Thus, in the present embodiment, after the erase command is received, the erase control signal may be generated based on the predetermined effective erasing execution times when the operating cycle is less than the threshold value.

In operation S370, an erase control signal is generated by increasing the effective erasing execution times for the lower memory cells. When the operating cycle is equal to or greater than the threshold value, the memory cells may have a distribution of threshold voltages as illustrated in FIG. 12B. In this case, upper voltages of the lower memory cells in program states may increase and thus the effective erasing execution times may be adjusted such that the effective erasing execution times for the lower memory cells are greater than a predetermined value. Also, the erase control signal may be generated based on the reset effective erasing execution times.

Figure 15A:
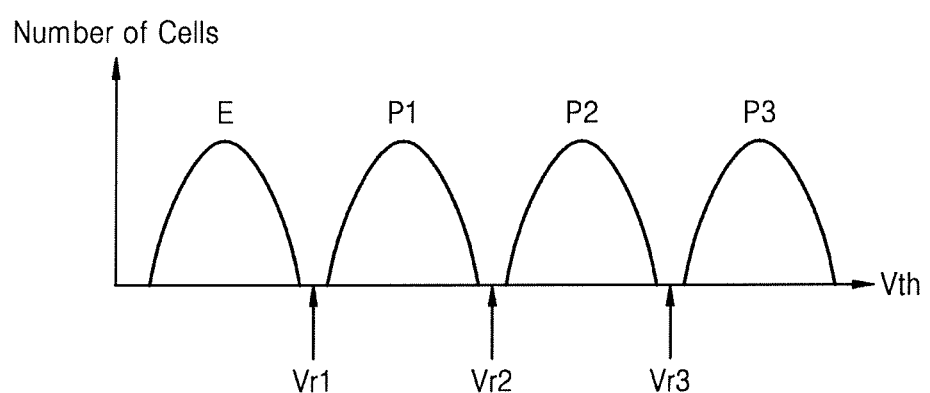
FIG. 15A is a graph showing a distribution of threshold voltages of memory cells after programming of a memory device is completed.
Figure 15B:
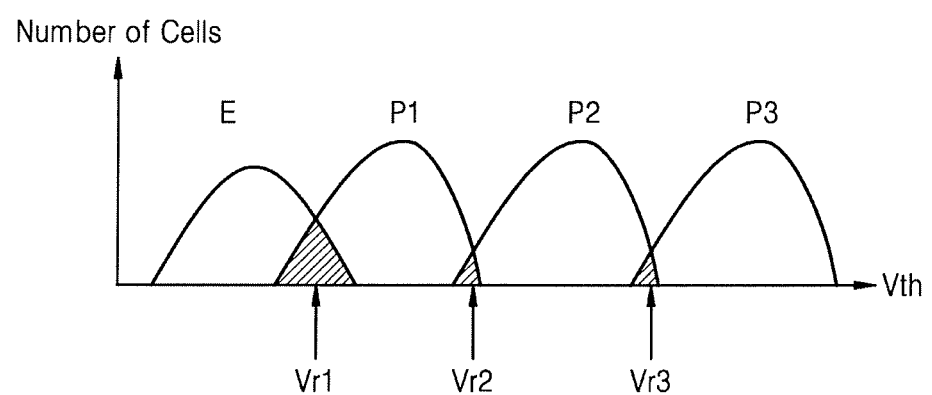
FIG. 15B is a graph showing a distribution of threshold voltages of memory cells at a predetermined time after programming of the memory device having the distribution of threshold voltages of FIG. 15A is completed.

FIG. 15A is a graph showing a distribution of threshold voltages of memory cells after programming of a memory device is completed. FIG. 15B is a graph showing a distribution of threshold voltages of the memory cells at a predetermined time after programming of the memory device having the distribution of threshold voltages of FIG. 15A is completed.

In FIG. 15A, a horizontal axis denotes a threshold voltage Vth and a vertical axis denotes the number of memory cells. For example, when a memory cell is a multi-level cell programmed to a 2-bit, the memory cell may have an erase state E, a first program state P1, a second program state P2, or a third program state P3.

First to third read voltages Vr1, Vr2, and Vr3 respectively correspond to initially set default levels. For example, the first read voltage Vr1 is equal to a voltage between a distribution of threshold voltages of memory cells having the erase state E and a distribution of threshold voltages of memory cells having the first program state P1. The second read voltage Vr2 is equal to a voltage between a distribution of threshold voltages of memory cells having the first program state P1 and a distribution of threshold voltages of memory cells having the second program state P2. The third read voltage Vr3 is equal to a voltage between a distribution of threshold voltages of memory cells having the second program state P2 and a distribution of threshold voltages of memory cells having the third program state P3.

Referring to FIG. 15B, the distribution of threshold voltages Vth of memory cells respectively programmed to the erase state E and the first to third program states P1 to P3 may spread out so that two adjacent states overlap over the read voltages Vr1 to Vr3 as data retention times of the memory cells increase. Thus, the distribution of the threshold voltages Vth of the memory cells may change as illustrated in FIG. 15B. In FIG. 15B, a read error may occur in memory cells corresponding to shaded portions of graphs and thus the reliability of the memory device may be lowered.

As described above, as the data retention times of memory cells increases, lower voltages of the memory cells in the first to third program states P1 to P3 may be shifted to lower threshold voltages. Thus, according to the present embodiment, effective erasing execution times for erasing the memory cells in the first to third program states P1 to P3 may be decreased when the data retention times increase, and an erase control signal may be generated based on the decreased effective erasing execution times, as will be described in detail with reference to FIGS. 16 and 17 below.

Figure 16:
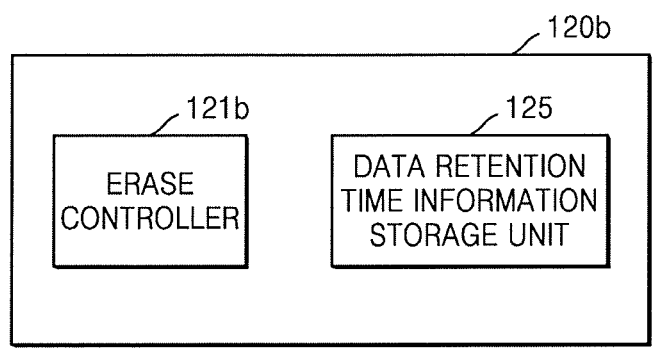
FIG. 16 is a block diagram of a control logic according to an exemplary embodiment of the present inventive concept.

FIG. 16 is a block diagram of a control logic 120*b* according to an exemplary embodiment of the present inventive concept.

Referring to FIG. 16, the control logic 120*b* may include an erase controller 121*b* and a data retention time information storage unit 125. The control logic 120*b* according to the present embodiment may be a modified example of the control logic 120 of FIG. 2. Thus, the description with reference to FIGS. 1 to 11, 15A, and 15B may also apply to the present embodiment and is not redundantly described here.

The data retention time information storage unit 125 may store data retention time information regarding data retention times of the memory cells included in the memory cell array 110. In this case, the data retention time information storage unit 125 may be embodied as a latch or a register. In some exemplary embodiments, the data retention time information may be stored in a region of the memory cell array 110. In some embodiment, the data retention time information may be stored in the buffer memory of the memory controller 200. In some exemplary embodiments, the data retention time information may be stored in an additional nonvolatile memory of the memory system 10.

In one exemplary embodiment, the data retention times may be determined based on program order stamps (POSs) representing a relative order of the program operation. For example, the data retention time information storage unit 125 may store a POS allocated when the program operation or the erase operation is performed on the memory cells, and update the information regarding the data retention times when a new POS is allocated. In the present embodiment, the data retention time information storage unit 125 may sequentially store POSs in a unit of at least one word line.

The erase controller 121b may change an effective erasing execution time determined in a unit of at least one word line, based on the data retention time information, and generate an erase control signal based on the changed effective erasing execution time. For example, when the data retention times are less than a threshold value, the erase controller 121b may generate the erase control signal based on the determined effective erasing execution times. When the data retention times are equal to or greater than the threshold value, the erase controller 121b may change the determined effective erasing execution times to be less than predetermined effective erasing execution times determined for lower memory cells, and generate the erase control signal based on the changed effective erasing execution times.

Figure 17:
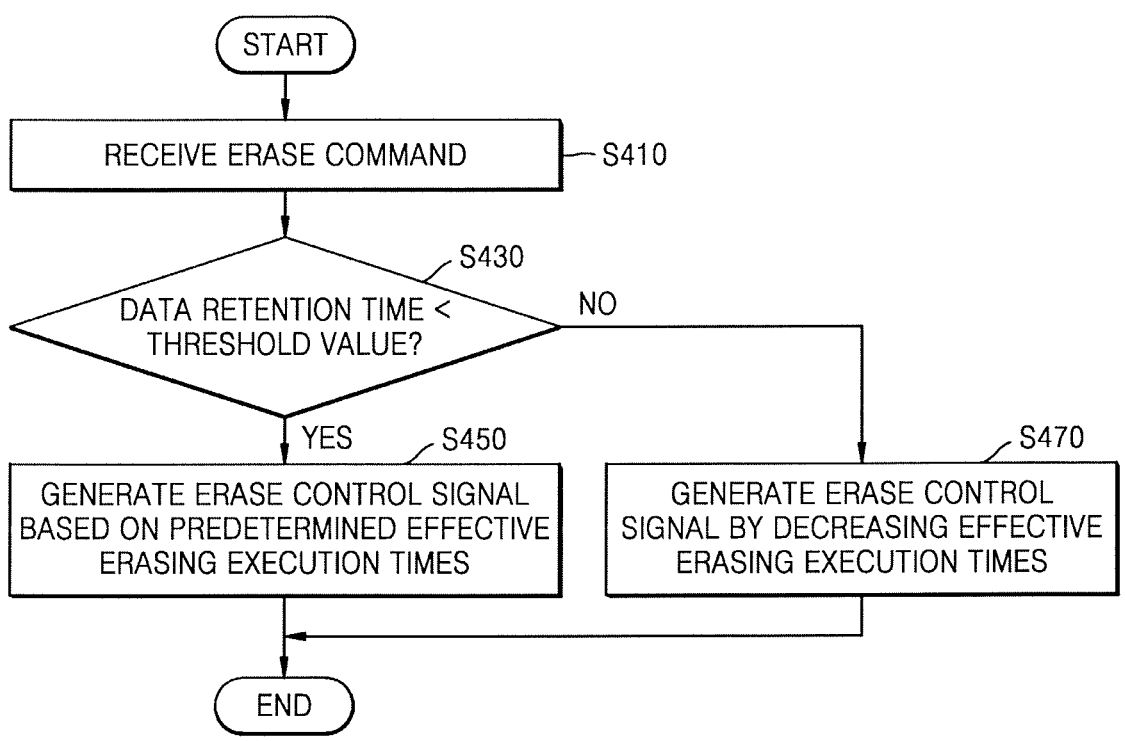
FIG. 17 is a flowchart of a method of generating an erase control signal of a memory device according to an exemplary embodiment of the present inventive concept.

FIG. 17 is a flowchart of a method of generating an erase control signal of a memory device according to an exemplary embodiment of the present inventive concept.

The method of FIG. 17 according to the present embodiment may be performed by a memory device (e.g., the memory device 100 of FIG. 1) when an erase command is received from a memory controller (e.g., the memory controller 200 of FIG. 1). For example, the method of FIG. 17 according to the present embodiment may include operations that are sequentially performed by, for example, the control logic 120b of FIG. 16.

In operation S410, an erase command is received. For example, the control logic 120b may receive the erase command from the memory controller 200. However, the inventive concept is not limited thereto, and a command (e.g., a pre-program command, etc.) for preparing the erase operation may be received from the memory controller 200 to perform the following operations in some exemplary embodiments. For example, the following operations may be performed to generate the erase control signal before the erase operation is substantially performed.

In operation S430, it is determined whether data retention times of memory cells are less than a threshold value. In one exemplary embodiment, the data retention times may be determined based on POSs representing a relative order of the program operation. Operation S450 is performed when it is determined that the data retention times are less than the threshold value, and operation S470 is performed it is determined that the data retention times are equal to or greater than the threshold value. Operation S450 may be performed when it is determined that the data retention times are less than the threshold value, and operation S470 may be performed when the data retention times are greater than the threshold value. However, the inventive concept is not limited thereto, and it may be determined in operation S430 whether the data retention times are greater than the threshold value.

In operation S450, an erase control signal is generated based on predetermined effective erasing execution times. When the data retention times are less than a threshold value, the memory cells may have, for example, a distribution of threshold voltages as illustrated in FIG. 15A. As in operation S110 of FIG. 6, an erase controller (e.g., the erase controller 121 of FIG. 2) may determine effective erasing execution times beforehand such that effective erasing execution times for lower memory cells are relatively short. In this case, operation S110 may be performed before the erase command is received and information regarding the determined effective erasing execution times may be stored. Thus, in the present embodiment, after the erase command is received, the erase control signal may be generated based on the predetermined effective erasing execution times when the data retention times are less than the threshold value.

In operation S470, an erase control signal is generated by decreasing effective erasing execution times. When the data retention times are equal to or greater than the threshold value, the memory cells may have, for example, a distribution of threshold voltages as illustrated in FIG. 15B. In this case, lower voltages of the memory cells in various program states may decrease and thus the effective erasing execution times may be adjusted such that effective erasing execution times for memory cells are less than a predetermined value. The erase control signal may be generated based on the adjusted effective erasing execution times.

Figure 18:
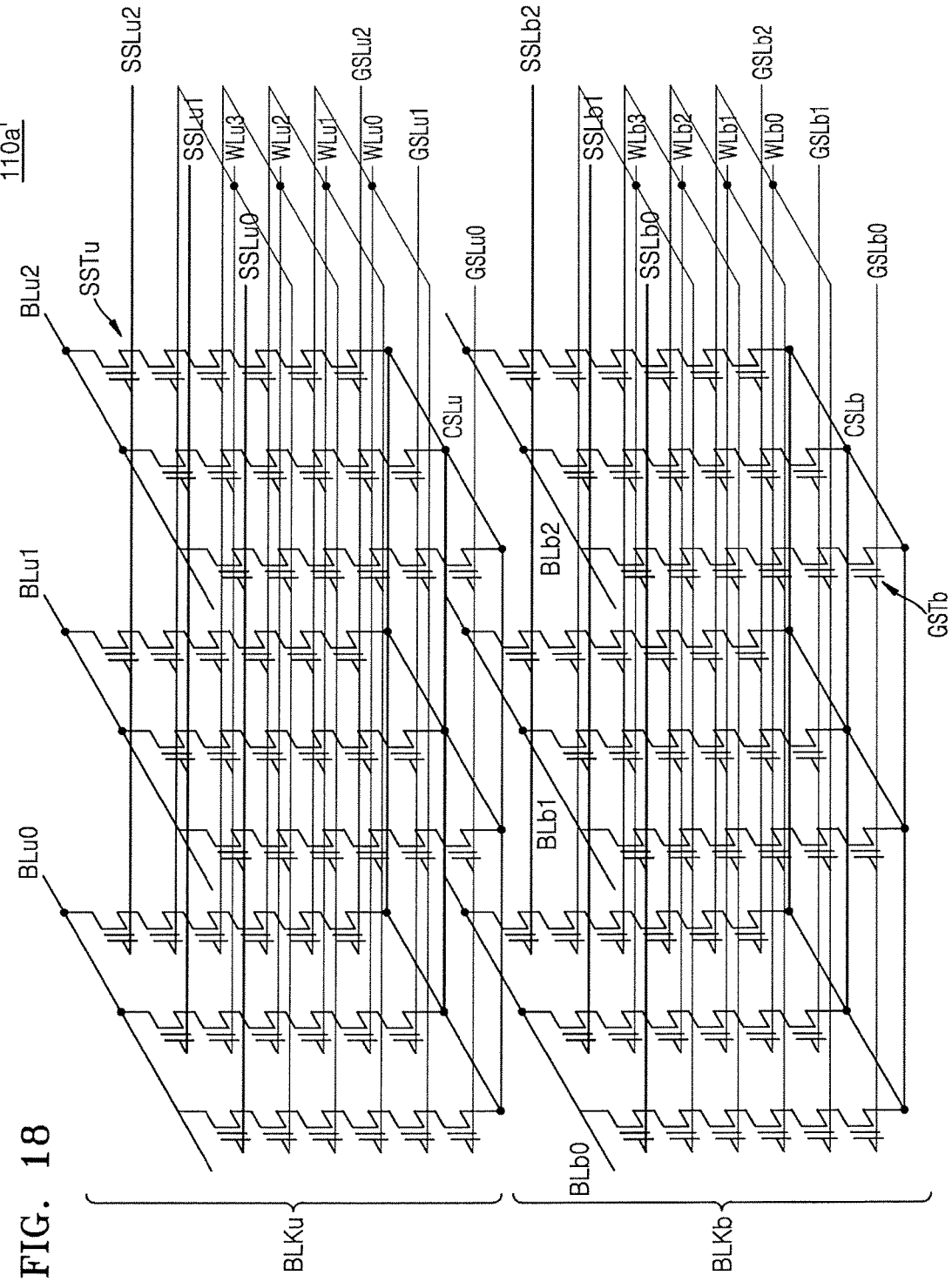
FIG. 18 is a circuit diagram of an example of a memory cell array of FIG. 2.

FIG. 18 is a circuit diagram of an example 110a' of a memory cell array of FIG. 2.

Referring to FIG. 18, the memory cell array 110a' may include a plurality of blocks BLKb and BLKu arranged in a vertical direction. For example, the memory cell array 110a' may include a lower block BLKb located on a substrate, and an upper block BLKu located on the lower block BLKb. Each of the lower block BLKb and the upper block BLKu may be a vertical NAND flash memory.

The lower block BLKb may include a plurality of NAND strings, a plurality of word lines WLb0 to WLb3, a plurality of bit lines BLb0 to BLb2, a plurality of ground selection lines GSLb0 to GSLb2, a plurality of string selection lines SSLb0 to SSLb2, and a common source line CBLb. Here, the number of NAND strings, the number of word lines, the number of bit lines, the number of ground selection lines, and the number of string selection lines may vary according to an embodiment.

The upper block BLKu may include a plurality of NAND strings, a plurality of word lines WLu0 to WLu3, a plurality of bit lines BLu0 to BLu2, a plurality of ground selection lines GSLu0 to GSLu2, a plurality of string selection lines SSLu0 to SSLu2, and a common source line CBLu. Here, the number of NAND strings, the number of word lines, the number of bit lines, the number of ground selection lines, and the number of string selection lines may vary according to an embodiment.

As described above, the lower block BLKb and the upper block BLKu may be embodied to be substantially the same, and may be substantially the same as the first block BLK1 of FIG. 4. The diameter of a channel hole of a memory cell connected to the first word line WLb0 of the lower block BLKb may be substantially the same as the diameter of a channel hole of a memory cell connected to the first word line WLu0 of the upper block BLKu, and may be relatively small. Also, the diameter of a channel hole of a memory cell connected to the fourth word line WLb3 of the lower block BLKb may be substantially the same as the diameter of a channel hole of a memory cell connected to the fourth word line WLu3 of the upper block BLKu, and may be relatively large.

Thus, according to the present embodiment, an effective erasing execution time corresponding to the first word line WLb0 of the lower block BLKb may be substantially the same as an effective erasing execution time corresponding to the first word line WLu0 of the upper block BLKu. Thus, a voltage change time point corresponding to the first word line WLb0 may be substantially the same as a voltage change time point corresponding to the first word line WLu0. In this case, the distance between the first word line WLu0 of the upper block BLKu and the substrate may be greater than the distance between the first word line WLb0 of the lower block BLKb and the substrate, but effective erasing execution times during which a word line erase voltage, e.g., the first voltage of FIG. 8, is applied to the first word lines WLu0 and WLb0 may be substantially the same.

An effective erasing execution time corresponding to the fourth word line WLb3 of the lower block BLKb may be substantially the same as effective erasing execution time corresponding to the fourth word line WLu3 of the upper block BLKu. In this case, the distance between the fourth word line WLu0 of the upper block BLKu and the substrate is greater than the distance between the fourth word line WLb0 of the lower block BLKb and the substrate, but effective erasing execution times during which a word line erase voltage, e.g., the first voltage of FIG. 8, is applied to the first word lines WLu0 and WLb0 may be substantially the same.

For example, according to the present embodiment, a control logic (e.g., the control logic 120 of FIG. 2) may generate an erase control signal such that effective erasing execution times or voltage change time points corresponding to word lines located at a level corresponding to the lower block BLKb and the upper block BLKu are the same. Thus, according to the present embodiment, effective erasing execution times or voltage change time points are not uniformly increased based on the distances between the substrate and the word lines, but may be individually determined by taking account into both of the distances between the substrate and the word lines and the operations of the memory cells according to the distances.

Figure 19:
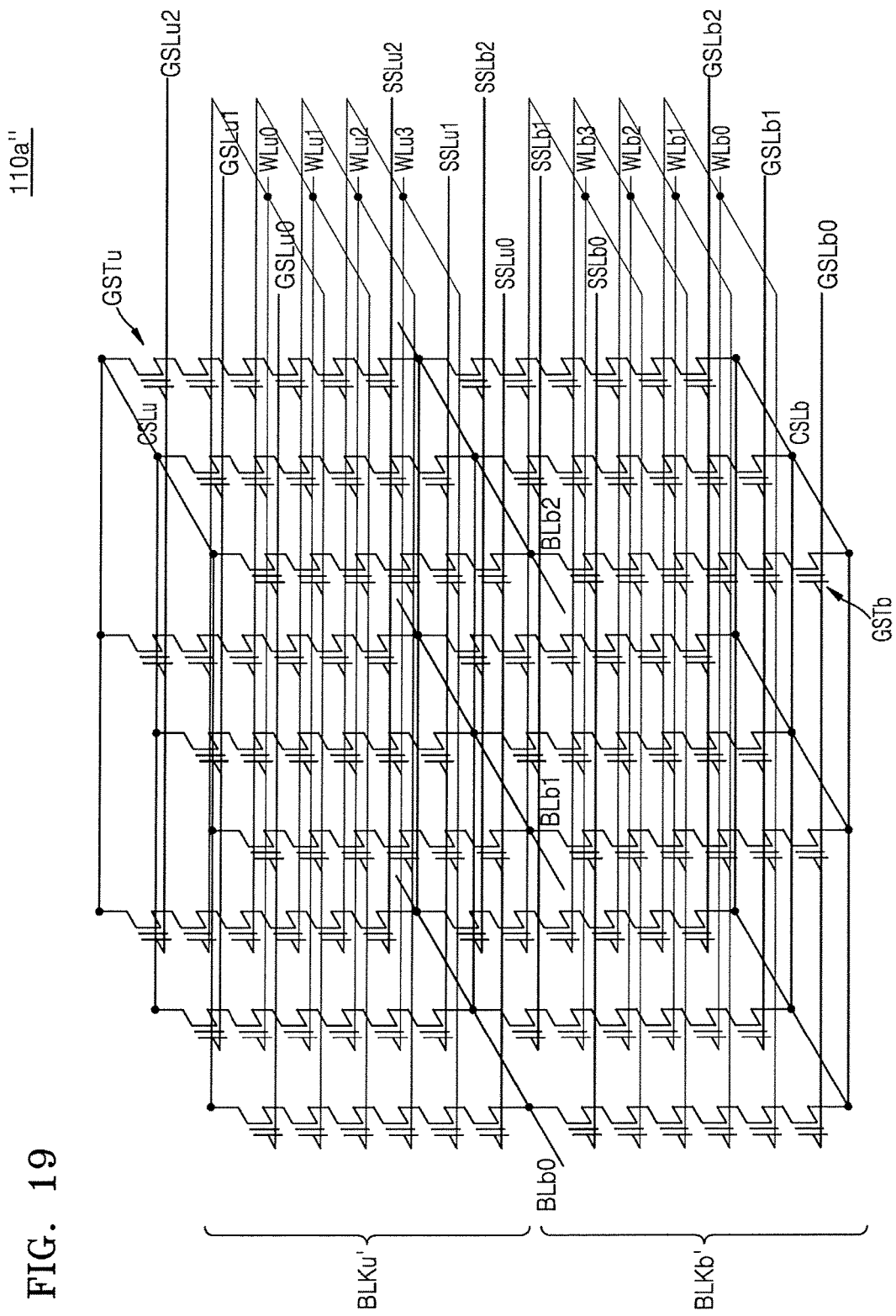
FIG. 19 is a circuit diagram of another example of the memory cell array of FIG. 2.

FIG. 19 is a circuit diagram of another example 110a" of a memory cell array of FIG. 2.

Referring to FIG. 19, the memory cell array 110a" may include a plurality of blocks BLKb' and BLKu' arranged in a vertical direction. For example, the memory cell array 110a" may include the lower block BLKb' located on a substrate, and an upper block BLKu' located on the lower block BLKb'. Each of the lower block BLKb' and the upper block BLKu' may be a vertical NAND flash memory. The memory cell array 110a" according to the present embodiment is a modified example of the memory cell array 110a' of FIG. 18 and will be described focusing on the differences from the memory cell array 110a' of FIG. 19 below.

The lower block BLKb' may include a plurality of NAND strings, a plurality of word lines WLb0 to WLb3, a plurality of bit lines BLb0 to BLb2, a plurality of ground selection lines GSLb0 to GSLb2, a plurality of string selection lines SSLb0 to SSLb2, and a common source line CBLb. Here, the number of NAND strings, the number of word lines, the number of bit lines, the number of ground selection lines, and the number of string selection lines may vary according to an embodiment.

The upper block BLKu' may include a plurality of NAND strings, a plurality of word lines WLu0 to WLu3, the plurality of bit lines BLb0 to BLb2, a plurality of ground selection lines GSLu0 to GSLu2, a plurality of string selection lines SSLu0 to SSLu2, and a common source line CBLu. Here, the number of NAND strings, the number of word lines, the number of bit lines, the number of ground selection lines, and the number of string selection lines may vary according to an embodiment.

As described above, the upper block BLKu' may have a shape obtained by turning the lower block BLKb' upside down with respect to the substrate in the vertical direction, and the plurality of bit lines BLb0 to BLb2 may be shared by the upper block BLKu' and the lower block BLKb'. Also, corresponding word lines may be shared by the upper block BLKu' and the lower block BLKb'. For example, the word lines WLu0 and WLb0 may be connected to each other.

According to the present embodiment, the same effective erasing execution time or the same voltage change time point may be applied to the first word line WLb0 of the lower block BLKb' and the first word line WLu0 of the upper block BLKu'. Also, the same effective erasing execution time or the same voltage change time point may be applied to the fourth word line WLb3 of the lower block BLKb' and the fourth word line WLu3 of the upper block BLKu'. For example, an effective erasing execution time corresponding to word lines of the lower block BLKb' may increase as the distances between the word lines and the substrate increase. An effective erasing execution time corresponding to word lines of the upper block BLKu' may decrease as the distances between the word lines and the substrate increase.

For example, according to the present embodiment, a control logic (e.g., the control logic 120 of FIG. 2) may generate the erase control signal such that effective erasing execution times or voltage change time points corresponding to word lines located at a level corresponding to the lower block BLKb' and the upper block BLKu' are the same. Thus, according to the present embodiment, effective erasing execution times or voltage change time points are not uniformly increased based on the distances between the substrate and the word lines, but may be individually determined by taking account into both of the distances between the substrate and the word lines and the operations of the memory cells according to the distances.

Figure 20:
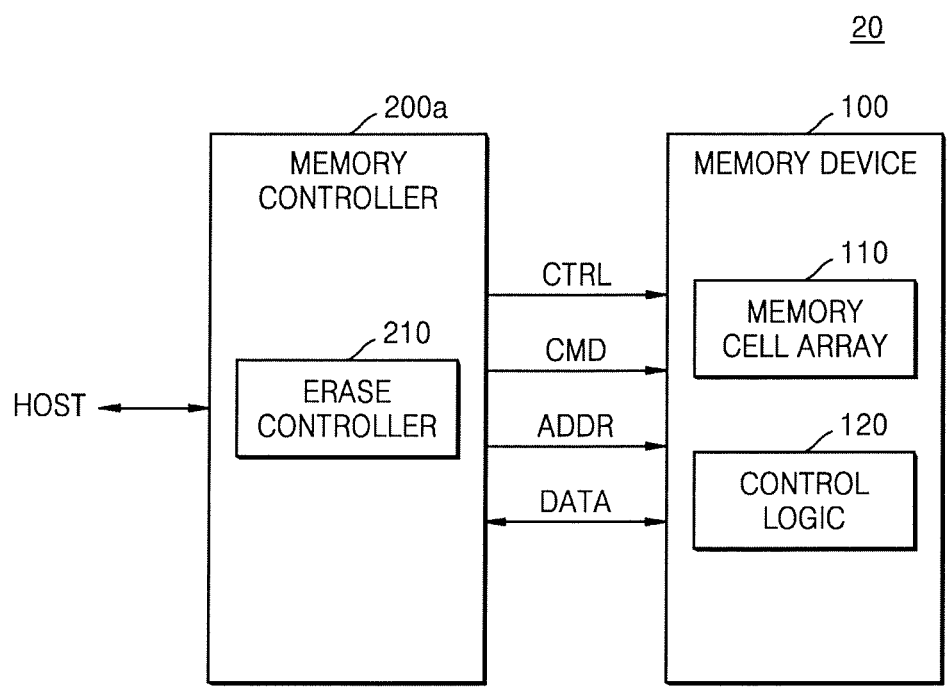
FIG. 20 is a schematic block diagram of a memory system according to an exemplary embodiment of the present inventive concept.

FIG. 20 is a schematic block diagram of a memory system 20 according to an exemplary embodiment of the present inventive concept.

Referring to FIG. 20, the memory system 20 may include a memory device 100 and a memory controller 200a. The memory controller 200a may include an erase controller 210. The memory device 100 according to the present embodiment may be substantially the same as the memory device 100 of FIG. 1. Thus, the above description with reference to FIGS. 1 to 19 may also apply to the present embodiment and is not redundantly described here.

The erase controller 210 may determine effective erasing execution times or voltage change time points in a unit of at least one word line, based on the diameters of channel holes or the thicknesses of tunneling insulating layers, and generate an erase control signal based on the determined effective erasing execution times or voltage change time points. The erase control signal may be transmitted to the memory device 100 using a command, an address, or data.

In one exemplary embodiment, the erase controller 210 may determine an effective erasing execution time or a voltage change time point in a unit of the word lines, based on the distances between a substrate and the word lines. Information regarding the effective erasing execution time or the voltage change time point determined in units of the word lines may be stored in the buffer memory included in the memory controller 200a.

In one exemplary embodiment, the erase controller 210 may change the effective erasing execution times or the voltage change time point in the unit of the word lines, based on operation cycle information. For example, the erase controller 210 may determine initial effective erasing execution times or initial voltage change time points to be applied when an operating cycle count is less than a threshold value. Also, the erase controller 210 may determine late effective erasing execution times or late voltage change time points to be applied when the operating cycle count is equal to or greater than the threshold value. In this case, information regarding the determined initial effective erasing execution times or initial voltage change time points and information regarding the determined late effective erasing execution times or late voltage change time points may be stored in the buffer memory included in the memory controller 200a.

In one exemplary embodiment, the erase controller 210 may change effective erasing execution time or voltage change time point in a unit of word lines, based on data retention time information. For example, the erase controller 210 may determine initial effective erasing execution times or initial voltage change time points to be applied when data retention times are less than a threshold value. Also, the erase controller 210 may determine late effective erasing execution times or later voltage change time points to be applied when the data retention times are equal to or greater than the threshold value. In this case, information regarding the determined initial effective erasing execution time or initial voltage change time point and information regarding the determined late effective erasing execution time or late voltage change time point may be stored in the buffer memory included in the memory controller 200a.

Figure 21:
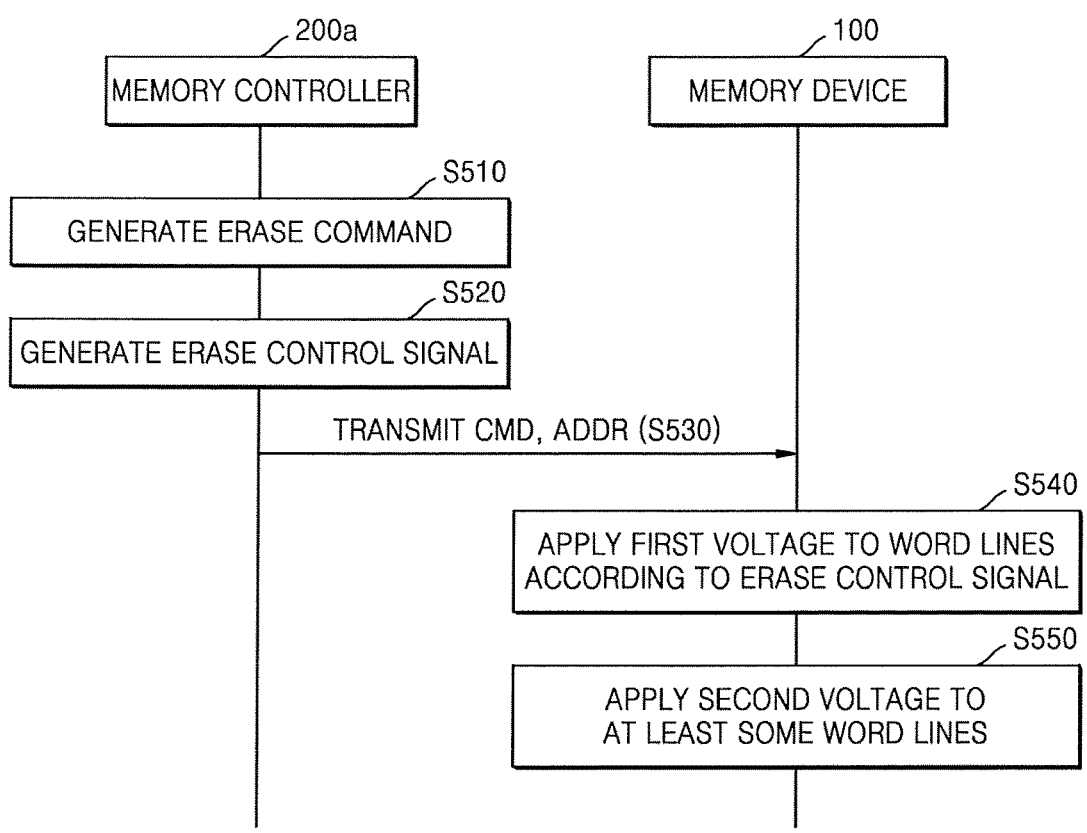
FIG. 21 is a flowchart illustrating operations of a memory controller and a memory device according to an exemplary embodiment of the present inventive concept.

FIG. 21 is a flowchart illustrating operations of a memory controller 200a and a memory device 100 according to an exemplary embodiment of the present inventive concept.

Referring to FIG. 21, in operation S510, the memory controller 200a generates an erase command. In operation S520, the memory controller 200a generates an erase control signal. For example, the erase controller 210 may generate the erase control signal, based on effective erasing execution times or voltage change time points determined in a unit of at least one word lines. In one exemplary embodiment, an effective erasing execution time for a lower word line may be shorter than that for an upper word line.

In operation S530, the memory controller 200a transmits a command and an address to the memory device 100. The command may be an erase command, and the address may be an address corresponding to a block to be erased. However, the inventive concept is not limited thereto, and the address may correspond to a sub-block to be erased. The sub-block may correspond to a region of a block.

In operation S540, the memory device 100 applies a first voltage to the word lines according to the erase control signal. For example, the memory device 100 may apply the first voltage corresponding to a word line erase voltage to word lines included in a memory block selected to perform the erase operation, and apply a substrate erase voltage to a substrate. In this case, the substrate erase voltage may be a high voltage, e.g., about 16 to 20 V, and the first voltage may be a low voltage which approximates about 0V. Thus, in operation S540, the erase operation may be substantially performed on the memory cells.

In operation S550, the memory device 100 applies a second voltage to at least some word lines. For example, the memory device 100 may apply the second voltage to some word lines at voltage change points according to the erase control signal. In this case, the voltage change time points may be different for the word lines. In one exemplary embodiment, the voltage change time points may become delayed as the distance to the substrate increases. Here, the second voltage may be greater than the first voltage. Thus, in operation S550, performing of the erase operation on the at least some memory cells to which the second voltage is applied may be substantially stopped.

Figure 22:
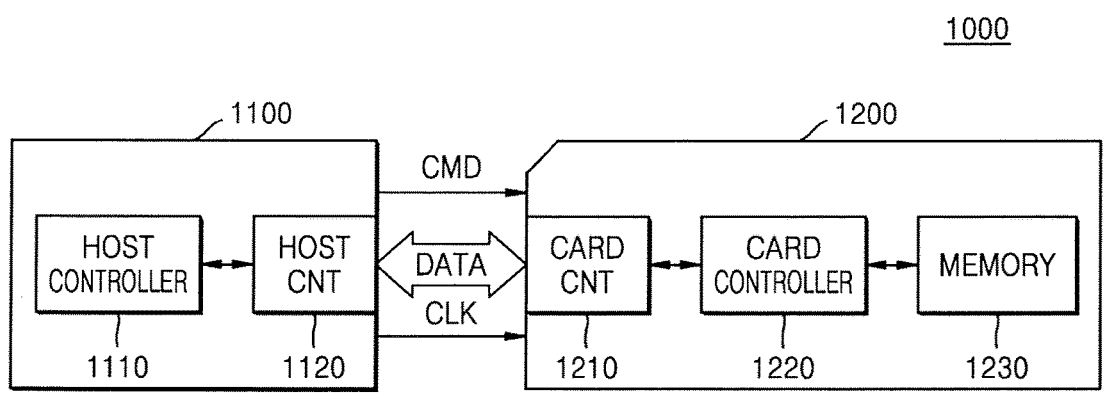
FIG. 22 is a block diagram of a memory card system according to an exemplary embodiment of the present inventive concept.

FIG. 22 is a block diagram of a memory card system 1000 according to an exemplary embodiment of the present inventive concept.

Referring to FIG. 22, the memory card system 1000 may include a host 1100 and a memory card 1200. The host 1100 may include a host controller 1110 and a host connection unit 1120. The memory card 1200 may include a card connection unit 1210, a card controller 1220, and a memory device 1230. The memory card 1200 may be embodied using the embodiments of FIGS. 1 to 21.

For example, in the memory card 1200, in an erase interval in which the erase operation is performed, a first word line erase voltage may be applied to the word lines for different effective erasing execution times for the word lines, and a second word line erase voltage may be applied to at least some word lines at different voltage change time points for the word lines. In this case, the second word line erase voltage may be higher than the first word line erase voltage. Thus, performing of the erase operation on the at least some memory cells to which the second word line erase voltage is applied may be substantially stopped after the different voltage change time points.

Thus, the differences between the operating characteristics of the memory cells caused by different geometric shapes of the memory cells due to the distances between the substrate and the word lines may be compensated for. Thus, even if the speed of programming/erasing a memory cell including either a channel hole having a small diameter or a thin tunneling insulating layer is high, the erase operation may be performed based on the erase control signal. Accordingly, threshold voltages of memory cells included in a NAND string may correspond to the substantially same erase state.

The memory card 1200 may be configured to communicate with the host 1100 via at least one among various protocols, e.g., a universal serial bus (USB), a MultiMediaCard (MMC), a peripheral component interconnect express (PCI-E), an advanced technology attachment (ATA), a serial-ATA, a parallel-ATA, a small computer system interface (SCSI), an enhanced small device interface (ESDI), and an integrated drive electronics (IDE).

The host 1100 may write data to or read data from the memory card 1200. The host controller 1110 may transmit a command CMD, a clock signal CLK generated by a clock generator (not shown) included in the host 1100, and data DATA to the memory card 1200 via the host connection unit 1120.

The card controller 1220 may store data in the memory device 1230 in synchronization with a clock signal CLK generated by a clock generator (not shown) included in the card controller 1220, in response to the command CMD received via the card connection unit 1210. The memory device 1230 may store the data DATA transmitted from the host 1100.

The memory card 1200 may be embodied as a compact flash card (CFC), a micro-drive, a smart media card (SMC), a multimedia card (MMC), a security digital card (SDC), a memory stick, a USB flash memory driver, etc.

Figure 23:
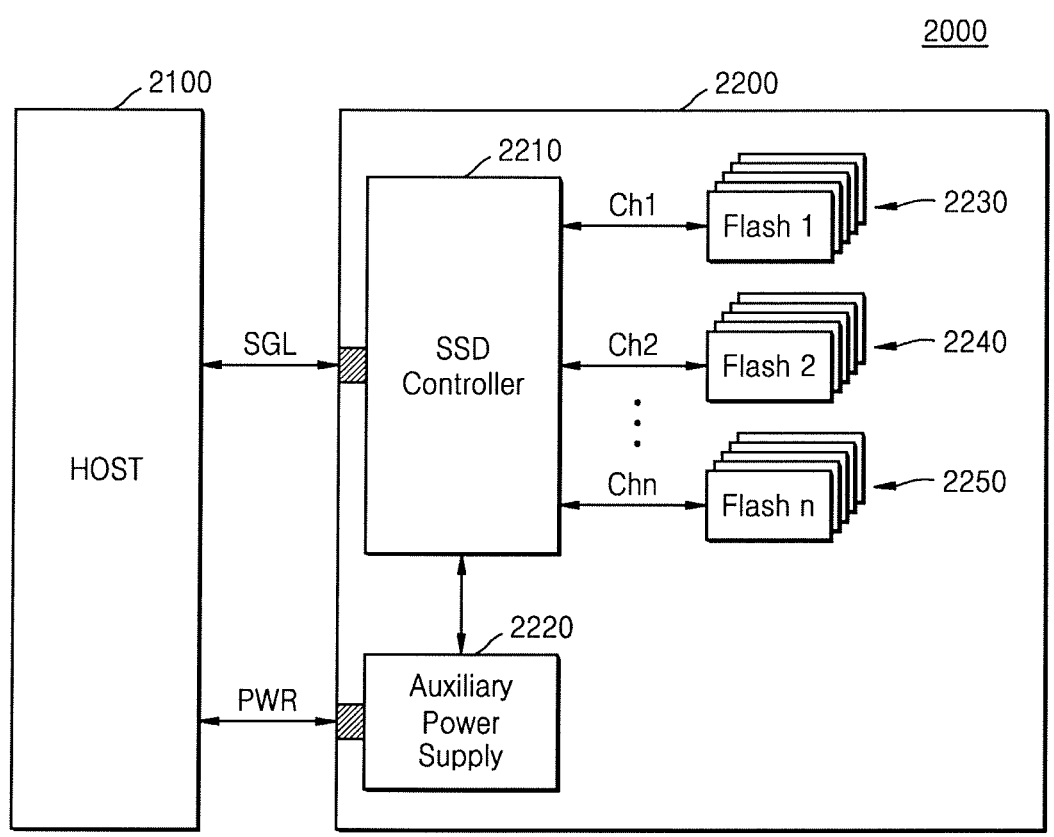
FIG. 23 is a block diagram of a solid-state drive (SSD) system according to an exemplary embodiment of the present inventive concept.

FIG. 23 is a block diagram of a solid-state drive (SSD) system 2000 according to an exemplary embodiment of the present inventive concept.

Referring to FIG. 23, the SSD system 2000 may include a host 2100 and an SSD 2200. The SSD 2200 may exchange signals with the host 2100 via a signal connector and be supplied power through a power connector (not shown). The SSD 2200 may include an SSD controller 2210, an auxiliary power supply device 2220, and a plurality of memory devices 2230, 2240, and 2250. The SSD 2200 may be embodied using the embodiments of FIGS. 1 to 18.

For example, in the plurality of memory devices 2230, 2240, and 2250, in an erase interval in which the erase operation is performed, a first word line erase voltage may be applied to the word lines for different effective erasing execution times for the word lines, and a second word line erase voltage may be applied to at least some word lines among the word lines at different voltage change time points for the word lines. In this case, the second word line erase voltage may be higher than the first word line erase voltage. Thus, performing of the erase operation on the at least some memory cells to which the second word line erase voltage is applied may be substantially stopped after the different voltage change time points.

Thus, the differences between the operating characteristics of the memory cells caused by different geometric shapes of the memory cells due to the distances between the substrate and the word lines may be compensated for. Thus, even if the speed of programming/erasing a memory cell including either a channel hole having a short diameter or a thin tunneling insulating layer is high, the erase operation may be performed based on the erase control signal. Accordingly, threshold voltages of memory cells included in a NAND string may correspond to the substantially same erase state.

A memory card, a nonvolatile memory device, and a card controller according to an embodiment of the inventive concept may be mounted using various types of packages. For example, a flash memory device and/or a memory controller according to an embodiment of the inventive concept may be mounted using various packages, e.g., a package-on-package (PoP), ball grid arrays (BGAs), chip scale packages (CSPs), a plastic leaded chip carrier (PLCC), a plastic dual in-line package (PDIP), a die-in-waffle pack, a die-in-wafer form, a chip-on-board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a system-in-package (SIP), a multi-chip package (MCP), a wafer-level fabricated package (WFP), a wafer-level processed stack package (WSP), etc.

While the inventive concept has been particularly shown and described with reference to exemplary embodiments thereof, it will be understood that various changes in form and details may be made therein without departing from the spirit and scope of the following claims.

What is claimed is:

1. A method of erasing a non-volatile memory device which includes a plurality of NAND strings, the method comprising:
   applying a first voltage to each of a plurality of word lines for a corresponding effective erasing execution time, wherein an erase operation is performed on a plurality of memory cells connected to each of the word lines for the corresponding effective erasing execution time; and
   applying a second voltage to each of at least some word lines among the word lines for a corresponding erasing-prohibited time after the corresponding effective erasing execution time elapses,
   wherein a sum of the corresponding effective erasing execution time and the corresponding erasing-prohibited time for each of the at least some word lines is substantially equal to an erasure interval during which an erase operation is performed using the first voltage and the second voltage higher than the first voltage, and
   wherein the plurality of word lines is stacked on a substrate.

2. The method of claim 1,
   wherein the applying of the first voltage comprises:
   applying the first voltage to a first word line adjacent to the substrate for a first effective erasing execution time and to a second word line above the first word line for a second effective erasing execution time which is longer than the first effective erasing execution time.

3. The method of claim 1,
   wherein the applying of the first voltage comprises:
   applying the first voltage to a first word line group including word lines adjacent to the substrate for a first effective erasing execution time and to a second word line group including word lines above the first word line group for a second effective erasing execution time which is longer than the first effective erasing execution time.

4. The method of claim 2,
   wherein the applying of the second voltage comprises:
   applying the second voltage to the first word line for a first erasing-prohibited time after the first effective erasing execution time and to the second word line for a second erasing-prohibited time after the second effective erasing execution time,
   wherein the second erasing-prohibited time is shorter than the first erasing-prohibited time,
   wherein a sum of the first effective erasing execution time and the first erasing-prohibited time is substantially equal to the erasure interval, and
   wherein a sum of the second effective erasing execution time and the second erasing-prohibited time is substantially equal to the erasure interval.

5. The method of claim 3,
   wherein the applying of the second voltage comprises:
   applying the second voltage to the first word line group for a first erasing-prohibited time after the first effective erasing execution time, and to the second word line group for a second erasing-prohibited time after the second effective erasing execution time,
   wherein the second erasing-prohibited time is shorter than the first erasing-prohibited time,
   wherein a sum of the first effective erasing execution time and the first erasing-prohibited time is substantially equal to the erasure interval, and
   wherein a sum of the second effective erasing execution time and the second erasing-prohibited time is substantially equal to the erasure interval.

6. The method of claim 1,
   wherein the erase operation is performed using the first voltage and is substantially prohibited using the second voltage.

7. The method of claim 1,
   wherein the applying of the first voltage and the applying of the second voltage are performed in a unit of at least one word line among the at least some word lines.

8. The method of claim 1, further comprising:
   generating an erase control signal by determining the corresponding effective erasing execution time in a unit of at least one word line, based on distances between the substrate and the word lines, and
   wherein the applying of the first voltage and the applying of the second voltage are performed based on the erase control signal.

9. The method of claim 8,
   wherein the erase control signal is generated such that the corresponding effective erasing execution time is increased when a program/erase cycle count is equal to or greater than a threshold value.

10. The method of claim 8,
wherein the erase control signal is generated such that the corresponding effective erasing execution time is decreased when a data retention time is equal to or greater than a threshold value.

11. A memory device comprising:
a memory cell array including a plurality of NAND strings,
each NAND string including plurality of memory cells and
each memory cell being connected to a corresponding word line of a plurality of word lines vertically stacked on a substrate; and
a control logic configured to generate an erase control signal to increase a voltage applied to each of the word lines at different time points according to distances between the substrate and word lines,
wherein the erase control signal is generated in a unit of at least one word line during an erase interval in which an erase operation is performed on the memory cells; and
wherein the control logic determines an effective erasing execution time in the unit of at least one word line based on distances between the substrate and the word lines, and generates the erase control signal according to the determined effective erasing execution time.

12. The memory device of claim 11,
wherein the control logic generates the erase control signal by determining the effective erasing execution time such that the effective erasing execution time increases when a program/erase cycle count is equal to or greater than a threshold value.

13. The memory device of claim 11,
wherein the control logic generates the erase control signal by determining the effective erasing execution time such that the effective erasing execution time decreases when a data retention time is equal to or greater than a threshold value.

14. The memory device of claim 11,
wherein a first effective erasing execution time is shorter than a second effective erasing execution time,
wherein a first voltage is applied to a first word line adjacent to the substrate for the first effective erasing execution time, and
wherein the first voltage is applied to a second word line above the first word line for the second effective erasing execution time.

15. A method of operating a non-volatile memory device, the method comprising:
applying a substrate voltage to a substrate in response to an erase command, wherein the substrate voltage is increased to a substrate erase voltage for a first erase interval and the substrate erase voltage is maintained for a second erase interval;
applying a first voltage to a first word line for a first effective erasing time after the first erase interval;
applying the first voltage to a second word line for a second effective erasing time after the first erase interval, wherein the second effective erasing time is longer than the first effective erasing time; and
applying a second voltage to the first word line for a first erasing-prohibited time after the first effective erasing time,
wherein the first word line and the second word line are vertically stacked on the substrate,
wherein the second word line is positioned above the first word line, and
wherein a sum of the first effective erasing time and the first erasing-prohibited time is substantially equal to the second effective erasing time.

16. The method of claim 15, further comprising:
applying a third voltage to a third word line for a second erasing-prohibited time,
wherein the third word line is interposed between the first word line and the second word line, and
wherein the second erasing-prohibited time is shorter than the first erasing-prohibited time.

17. The method of claim 16,
wherein the second voltage and the third voltage are substantially the same.

18. The method of claim 15,
wherein a plurality of memory cells connected to the first word line is erased for the first effective erasing execution time using a voltage difference between the first voltage and the substrate erase voltage, and
wherein after the first effective erasing execution time, a voltage difference between the second voltage and the substrate erase voltage is applied to the plurality of memory cells connected to the first word line for the first erasing-prohibited time.

19. The method of claim 15,
wherein the sum of the first effective erasing time and the first erasing-prohibited time is substantially equal to the second erase interval.

* * * * *